(12) United States Patent
Tamura et al.

(10) Patent No.: US 7,812,374 B2
(45) Date of Patent: Oct. 12, 2010

(54) SEMICONDUCTOR DEVICE AND FABRICATION METHOD THEREOF

(75) Inventors: Nobuyuki Tamura, Kyoto (JP); Ken Suzuki, Osaka (JP); Katsuhiro Ootani, Nara (JP)

(73) Assignee: Panasonic Corporation, Osaka (JP)

( * ) Notice: Subject to any disclaimer, the term of this patent is extended or adjusted under 35 U.S.C. 154(b) by 202 days.

(21) Appl. No.: 11/819,369

(22) Filed: Jun. 27, 2007

(65) Prior Publication Data

US 2008/0093673 A1     Apr. 24, 2008

(30) Foreign Application Priority Data

Oct. 20, 2006    (JP) .............. 2006-286203

(51) Int. Cl.
    *H01L 29/772*    (2006.01)
(52) U.S. Cl. .............. 257/206; 257/365; 257/371; 257/E21.64; 257/E21.125; 257/E29.345; 438/938
(58) Field of Classification Search ............. 257/365, 257/371, E21.64, E29.345, 206, E21.125; 438/938
    See application file for complete search history.

(56) References Cited

U.S. PATENT DOCUMENTS 7,312,485 B2 *  12/2007  Armstrong et al. .......... 257/255
7,414,293 B2 *  8/2008   Shimizu et al. ............. 257/371
7,423,330 B2 *  9/2008   Satoh ......................... 257/649
2003/0181005 A1 * 9/2003 Hachimine et al. ......... 438/231
2004/0075148 A1 * 4/2004 Kumagai et al. ............ 257/369

FOREIGN PATENT DOCUMENTS

JP    2003-60076    2/2003

* cited by examiner

*Primary Examiner*—Wael M Fahmy
*Assistant Examiner*—John C Ingham
(74) *Attorney, Agent, or Firm*—McDermott Will & Emery LLP

(57) ABSTRACT

A semiconductor device includes a first MIS transistor on a first active region of a semiconductor substrate, the first MIS transistor including: a first gate insulating film provided on the first active region; a first gate electrode provided on the first gate insulating film; a first stressor insulating film provided on an upper face and side faces facing in a gate length direction of the first gate electrode such that first stress acts on a channel of the first MIS transistor in the gate length direction; and a first base insulating film provided on side faces of the first gate electrode facing in a gate width direction, wherein the side faces of the first gate electrode facing in the gate width direction are not covered with the first stressor insulating film.

15 Claims, 18 Drawing Sheets

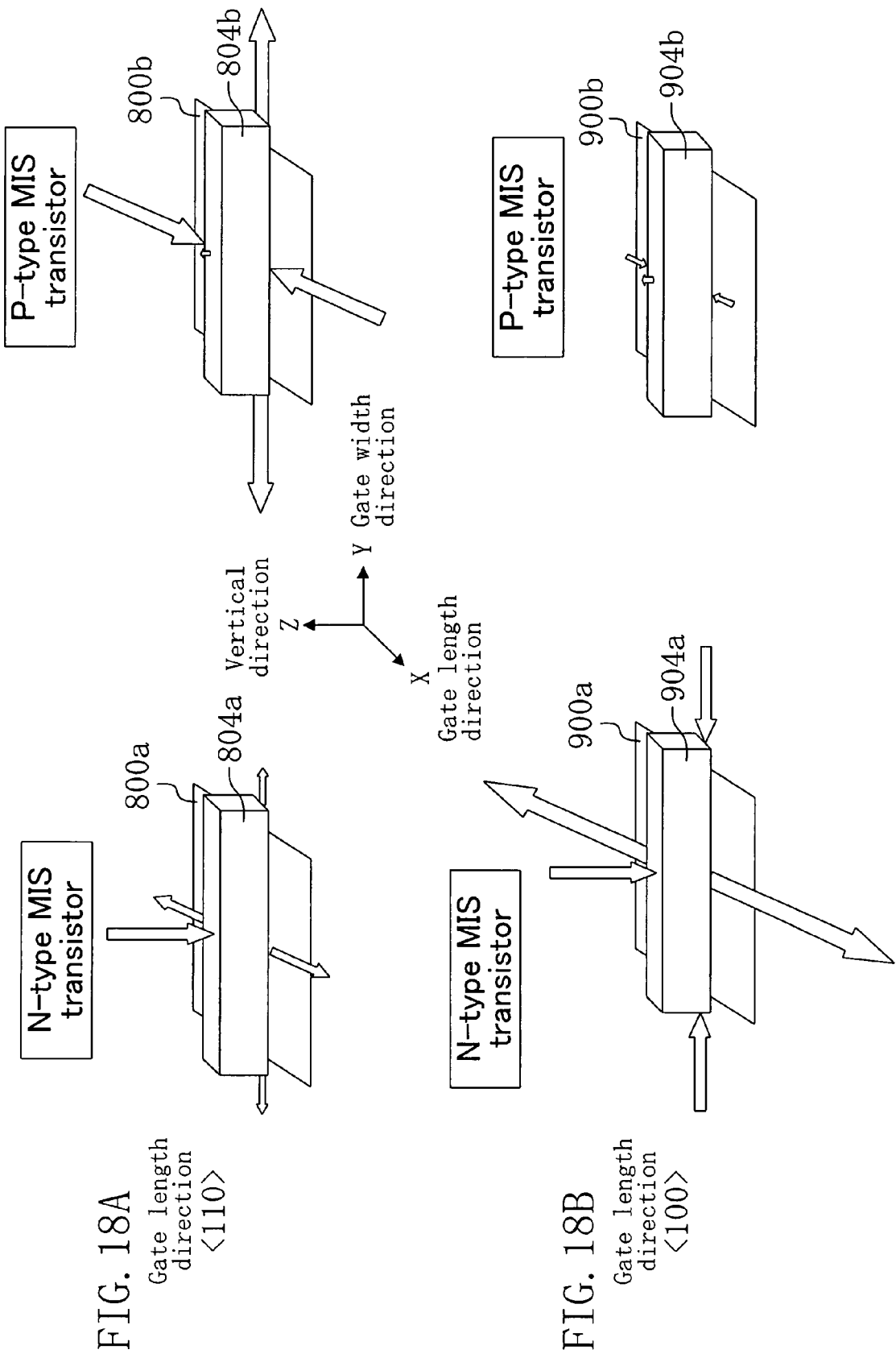

US 7,812,374 B2

SEMICONDUCTOR DEVICE AND FABRICATION METHOD THEREOF

CROSS-REFERENCE TO RELATED APPLICATION(S)

This application claims priority under 35 U.S.C. §119(a) on Japanese Patent Application No. 2006-286203 filed on Oct. 20, 2006, and the entire contents disclosed in the specification, drawings and claims of this application are hereby incorporated by reference.

BACKGROUND OF THE INVENTION

The present invention relates to a semiconductor device which has a stress insulating film on a gate electrode and to a fabrication method of such a semiconductor device.

A conventional semiconductor device which has a stress insulating film on a gate electrode with the view of improving the drivability of transistors has been proposed (see, for example, Japanese Laid-Open Patent Publication No. 2003-60076). Hereinafter, the conventional semiconductor device is described with reference to FIG. 17. FIG. 17 is a cross-sectional view of the structure of the conventional semiconductor device.

As shown in FIG. 17, a semiconductor substrate 700 made of silicon includes an isolation region 701 between an N-type MOS formation region N and a P-type MOS formation region P. In such a structure, the N-type MOS formation region includes an active region 700a which is part of the semiconductor substrate 700 surrounded by the isolation region 701, while the P-type MOS formation region includes an active region 700b which is another part of the semiconductor substrate 700 surrounded by the isolation region 701. A gate electrode 704a made of a conductive film is provided on the active region 700a of the N-type MOS formation region with a gate insulating film 703a made of an insulating film interposed therebetween. A gate electrode 704b made of a conductive film is provided on the active region 700b of the P-type MOS formation region with a gate insulating film 703b made of an insulating film interposed therebetween. The side faces of the gate electrodes 704a and 704b are covered with side walls 706a and 706b made of an insulating film.

The part of the active region 700a of the N-type MOS formation region diagonally under the gate electrode 704a is an N-type extension region 705a. The part of the active region 700a diagonally under the side wall 706a is an N-type source-drain region 707a. The part of the active region 700b of the P-type MOS formation region diagonally under the gate electrode 704b is a P-type extension region 705b. The part of the active region 700b diagonally under the side wall 706b is a P-type source-drain region 707b. Silicide films 708a and 708b are provided on the source-drain regions 707a and 707b, respectively. Silicide films 709a and 709b are provided on the gate electrodes 704a and 704b, respectively.

In the N-type MOS formation region, a tensile stressor insulating film 710 made of a silicon nitride film is provided on the semiconductor substrate 700 so as to cover the gate electrode 704a. On the other hand, in the P-type MOS formation region, a compressive stressor insulating film 711 made of a silicon nitride film is provided on the semiconductor substrate 700 so as to cover the gate electrode 704b. An interlayer insulating film 712 is provided on the stress insulating films 710 and 711.

According to the conventional semiconductor device, due to the tensile stressor insulating film 710 covering the gate electrode 704a, tensile stress acts on a channel of an N-type MOS transistor (i.e., a channel in the semiconductor substrate 700 which exists under the gate electrode 704a) in both gate length direction and gate width direction. On the other hand, due to the compressive stressor insulating film 711 covering the gate electrode 704b, compressive stress acts on a channel of a P-type MOS transistor (i.e., a channel in the semiconductor substrate 700 which exists under the gate electrode 704b) in both gate length direction and gate width direction.

However, the conventional semiconductor device is accompanied by the problems described below.

Herein, to improve the drivability of a MIS (Metal-Insulator-Semiconductor) transistor, the stress applied to the MIS transistor is directional. The orientation (tensile or compressive) and size of the stress applied to the channel of the MIS transistor are described below with reference to FIGS. 18A and 18B. FIG. 18A is a perspective view which illustrates the orientation and size of stress with which the drivability of N-type and P-type MIS transistors is improved where the gate length direction of the gate electrodes of the N-type and P-type MIS transistors is set to <110> direction. FIG. 18B is a perspective view which illustrates the orientation and size of stress with which the drivability of N-type and P-type MIS transistors is improved where the gate length direction of the gate electrodes of the N-type and P-type MIS transistors is set to <100> direction.

In the case where gate electrodes 804a and 804b are provided on active regions 800a and 800b which are the parts of a semiconductor substrate surrounded by an isolation region such that the gate length direction of the gate electrodes 804a and 804b is <110> direction as shown in FIG. 18A, it is necessary for improvement in drivability of the N-type MIS transistor to cause both tensile stress in the gate length direction and tensile stress in the gate width direction on the channel of the N-type MIS transistor. As for vertical stress from the gate electrode side with respect to the channel, compressive stress is effective.

On the other hand, to improve the drivability of the P-type MIS transistor, it is necessary to cause both compressive stress in the gate length direction and tensile stress in the gate width direction on the channel of the P-type MIS transistor.

In the case where gate electrodes 904a and 904b are provided on active regions 900a and 900b which are the parts of a semiconductor substrate surrounded by an isolation region such that the gate length direction of the gate electrodes 904a and 904b is <100> direction as shown in FIG. 18B, it is necessary for improvement in drivability of the N-type MIS transistor to cause both tensile stress in the gate length direction and compressive stress in the gate width direction on the channel of the N-type MIS transistor. As for vertical stress from the gate electrode side with respect to the channel, compressive stress is effective.

On the other hand, to improve the drivability of the P-type MIS transistor, it is necessary to cause compressive stress in the gate length direction on the channel of the P-type MIS transistor. (It should be noted that, as for the gate width direction, no matter which of compressive stress or tensile stress is applied, the applied stress rarely affects the characteristics of the P-type MIS transistor.)

Thus, to improve the drivability of the MIS transistors, the stress applied to the channel of the MIS transistors is directional.

In the case where, however, in the conventional semiconductor device, the gate length direction of the gate electrodes of the N-type and P-type MOS transistors is set to <110> direction, the above-described directional stress causes the problems described below.

In the N-type MOS transistor, referring to FIG. 17, the tensile stressor insulating film 710 covering the gate electrode 704a produces tensile stress in both gate length direction and gate width direction on the channel of the N-type MOS transistor, so that the drivability of the N-type MOS transistor is improved. However, although it is desirable in the P-type MOS transistor that compressive stress is caused in the gate length direction while tensile stress is caused in the gate width direction on the channel of the P-type MOS transistor (see FIG. 18A), the compressive stressor insulating film 711 covering the gate electrode 704b as shown in FIG. 17 causes compressive stress on the channel of the P-type MOS transistor not only in the gate length direction but also in the gate width direction, resulting in deterioration in drivability of the P-type MOS transistor.

In the case where, on the other hand, in the conventional semiconductor device, the gate length direction of the gate electrodes of the N-type and P-type MOS transistors is set to <100> direction, the above-described directional stress causes the problems described below.

In the P-type MOS transistor, referring to FIG. 17, the compressive stressor insulating film 711 covering the gate electrode 704b produces compressive stress on the channel of the P-type MOS transistor in the gate length direction, so that the drivability of the P-type MOS transistor is improved. However, although it is desirable in the N-type MOS transistor that tensile stress is caused in the gate length direction while compressive stress is caused in the gate width direction on the channel of the N-type MOS transistor (see FIG. 18B), the tensile stressor insulating film 710 covering the gate electrode 704a as shown in FIG. 17 causes tensile stress on the channel of the N-type MOS transistor not only in the gate length direction but also in the gate width direction, resulting in deterioration in drivability of the N-type MOS transistor.

As described above, the conventional semiconductor device has the stress insulating film 710 or 711 on all of the upper faces, side faces facing in the gate length direction, and side faces facing in the gate width direction of the gate electrodes 704a and 704b as shown in FIG. 17. In the case where the orientation of stress with which the drivability of a MIS transistor is improved differs between the gate length direction and the gate width direction, any one of the stress caused in the gate length direction and the stress caused in the gate width direction has such an orientation that the drivability of the MIS transistor is deteriorated. Therefore, the drivability of the MIS transistor is deteriorated.

SUMMARY OF THE INVENTION

In view of the above circumstances, an objective of the present invention is to provide a semiconductor device having a stress insulating film on a gate electrode wherein deterioration in drivability of a MIS transistor is prevented.

To achieve the above objective, a semiconductor device according to one aspect of the present invention includes a first MIS transistor on a first active region of a semiconductor substrate, the first MIS transistor including: a first gate insulating film provided on the first active region; a first gate electrode provided on the first gate insulating film; a first stressor insulating film provided on an upper face and side faces facing in a gate length direction of the first gate electrode such that first stress acts on a channel of the first MIS transistor in the gate length direction; and a first base insulating film provided on side faces of the first gate electrode facing in a gate width direction, wherein the side faces of the first gate electrode facing in the gate width direction are not covered with the first stressor insulating film.

In the semiconductor device according to one aspect of the present invention, the side faces of the first gate electrode facing in the gate width direction are not covered with the first stressor insulating film. Therefore, there is no probability that the first stress acts on the channel of the first MIS transistor in the gate width direction (i.e., there is no probability that the stress acts on the channel in the gate width direction with such an orientation that the drivability of the first MIS transistor is deteriorated). Thus, deterioration in drivability of the first MIS transistor is prevented.

In addition, in the semiconductor device according to one aspect of the present invention, the first stressor insulating film is provided on the upper face and side faces facing in the gate length direction of the first gate electrode. Therefore, the first stress acts on the channel of the first MIS transistor in the gate length direction (i.e., the stress acts on the channel in the gate length direction with such an orientation that the drivability of the first MIS transistor is improved). Thus, the drivability of the first MIS transistor is improved.

In the semiconductor device according to one aspect of the present invention, preferably, the first base insulating film is a second stressor insulating film which causes second stress on the channel of the first MIS transistor in the gate width direction; the first stress is any one of compressive stress and tensile stress; and the second stress is the other one of compressive stress and tensile stress.

In the above structure, the first stressor insulating film is provided on the upper face and side faces facing in the gate length direction of the first gate electrode, and in addition, the second stressor insulating film is provided on the side faces of the first gate electrode facing in the gate width direction. Therefore, the first stress acts on the channel of the first MIS transistor in the gate length direction, and in addition, the second stress acts on the channel of the first MIS transistor in the gate width direction (i.e., the stress acts on the channel in the gate width direction with such an orientation that the drivability of the first MIS transistor is improved). Thus, the drivability of the first MIS transistor is further improved.

In the semiconductor device according to one aspect of the present invention, preferably, the first MIS transistor is a P-type MIS transistor; the first stress is compressive stress; and the second stress is tensile stress. Preferably, a principal surface of the semiconductor substrate is (100) surface; and the gate length direction of the first gate electrode is <110> direction.

With the above structure, compressive stress acts on the channel of the P-type MIS transistor in the gate length direction while tensile stress acts on the channel in the gate width direction.

In the semiconductor device according to one aspect of the present invention, preferably, the first MIS transistor is an N-type MIS transistor; the first stress is tensile stress; and the second stress is compressive stress. Preferably, a principal surface of the semiconductor substrate is (100) surface; and the gate length direction of the first gate electrode is <100> direction.

With the above structure, tensile stress acts on the channel of the N-type MIS transistor in the gate length direction while compressive stress acts on the channel in the gate width direction.

In the semiconductor device according to one aspect of the present invention, preferably, the first MIS transistor further includes a first side wall provided between the side faces of the first gate electrode facing in the gate length direction and the first stressor insulating film and between the side faces of the first gate electrode facing in the gate width direction and the first base insulating film.

In the semiconductor device according to one aspect of the present invention, preferably, the first MIS transistor further includes a first side wall provided between the side faces of the first gate electrode facing in the gate length direction and the first stressor insulating film; and the first side wall does not exist between the side faces of the first gate electrode facing in the gate width direction and the first base insulating film.

With such a structure, the first side wall does not exist between the side faces of the first gate electrode facing in the gate width direction and the first base insulating film. Therefore, when the second stressor insulating film is used as the first base insulating film, the second stress efficiently acts on the channel of the first MIS transistor in the gate width direction. Thus, the drivability of the first MIS transistor is further improved.

In the semiconductor device according to one aspect of the present invention, preferably, the first active region is surrounded by an isolation region formed in the semiconductor substrate; the first MIS transistor further includes a first side wall provided on side faces of part of the first gate electrode which exists over the first active region; and the first side wall does not exist between side faces facing in the gate length direction of part of the first gate electrode which exists over the isolation region and the first stressor insulating film or between side faces facing in the gate width direction of the part of the first gate electrode which exists over the isolation region and the first base insulating film.

With the above structure, the side faces of the first gate electrode which exist over the isolation region are not covered with the first side wall. Therefore, when the second stressor insulating film is used as the first base insulating film, the second stress acts on the channel of the first MIS transistor in the gate width direction more efficiently.

The semiconductor device according to one aspect of the present invention preferably further includes a second MIS transistor provided on a second active region of the semiconductor substrate, the second MIS transistor including: a second gate insulating film provided on the second active region; a second gate electrode provided on the second gate insulating film; and a second base insulating film provided on the second gate electrode.

With the above structure, there is provided a semiconductor device including both the first MIS transistor with improved drivability and the second MIS transistor.

The semiconductor device according to one aspect of the present invention preferably further includes a second MIS transistor provided on a second active region of the semiconductor substrate, the second MIS transistor including a second gate insulating film provided on the second active region, a second gate electrode provided on the second gate insulating film, and a second base insulating film provided on the second gate electrode, wherein the second base insulating film is a third stressor insulating film which causes third stress on a channel of the second MIS transistor, and the third stressor insulating film and the second stressor insulating film are made of a same insulating film.

In the above structure, the third stressor insulating film is provided on the second gate electrode. Therefore, the third stress acts on the channel of the second MIS transistor (i.e., the stress acts on the channel with such an orientation that the drivability of the second MIS transistor is improved). Thus, the drivability of the second MIS transistor is improved.

In the semiconductor device according to one aspect of the present invention, preferably, the first MIS transistor is a P-type MIS transistor; the second MIS transistor is an N-type MIS transistor; the first stress is compressive stress; the second stress is tensile stress; and the third stress is tensile stress.

Preferably, a principal surface of the semiconductor substrate is (100) surface; and the gate length direction of the first and second gate electrodes is <110> direction.

With the above structure, compressive stress acts on the channel of the P-type MIS transistor in the gate length direction while tensile stress acts on the channel in the gate width direction. In addition, tensile stress acts on the channel of the N-type MIS transistor.

In the semiconductor device according to one aspect of the present invention, preferably, the first MIS transistor is an N-type MIS transistor; the second MIS transistor is a P-type MIS transistor; the first stress is tensile stress; the second stress is compressive stress; and the third stress is compressive stress. Preferably, a principal surface of the semiconductor substrate is (100) surface; and the gate length direction of the first and second gate electrodes is <100> direction.

With the above structure, tensile stress acts on the channel of the N-type MIS transistor in the gate length direction while compressive stress acts on the channel in the gate width direction. In addition, compressive stress acts on the channel of the P-type MIS transistor.

In the semiconductor device according to one aspect of the present invention, preferably, the second MIS transistor further includes a second side wall provided between side faces of the second gate electrode and the second base insulating film.

In the semiconductor device according to one aspect of the present invention, preferably, the second active region is surrounded by an isolation region formed in the semiconductor substrate; the first active region and the second active region are separated from each other by the isolation region; the second MIS transistor further includes a second side wall provided on side faces of part of the second gate electrode which exists over the second active region; and the second side wall does not exist between side faces of part of the second gate electrode which exists over the isolation region and the third stressor insulating film.

In the above structure, the side faces of the second gate electrode which exist over the isolation region are not covered with the second side wall. Therefore, the third stress efficiently acts on the channel of the second MIS transistor.

To achieve the above objective, a semiconductor device fabrication method according to one aspect of the present invention is a method for fabricating a semiconductor device which has a first MIS transistor formed on a first active region of a semiconductor substrate, the method comprising the steps of: (a) sequentially forming a first gate insulating film and a first gate electrode on the first active region; (b) forming a first stressor insulating film on the first gate electrode; (c) removing part of the first stressor insulating film which exists on side faces of the first gate electrode facing in a gate width direction; and (d) after step (c), forming a first base insulating film on side faces of the first gate electrode facing in the gate width direction, wherein the first stressor insulating film causes first stress on a channel of the first MIS transistor which has the first gate electrode.

With the semiconductor device fabrication method according to one aspect of the present invention, the parts of the first stressor insulating film formed on the side faces of the first gate electrode facing in the gate width direction are removed. Therefore, the side faces of the first gate electrode facing in the gate width direction are not covered with the first stressor insulating film. As a result, there is no probability that the first stress acts on the channel of the first MIS transistor in the gate width direction (i.e., there is no probability that the stress acts on the channel in the gate width direction with such an orientation that the drivability of the first MIS transistor is deteriorated). Thus, deterioration in drivability of the first MIS transistor is prevented.

In addition, with the semiconductor device fabrication method according to one aspect of the present invention, the first stressor insulating film is provided on the upper face and side faces facing in the gate length direction of the first gate electrode. Therefore, the first stress acts on the channel of the first MIS transistor in the gate length direction (i.e., the stress acts on the channel in the gate length direction with such an orientation that the drivability of the first MIS transistor is improved). Thus, the drivability of the first MIS transistor is improved.

In the semiconductor device fabrication method according to one aspect of the present invention, preferably, step (d) includes forming as the first base insulating film a second stressor insulating film which causes second stress on the channel of the first MIS transistor in the gate width direction; the first stress is any one of compressive stress and tensile stress; and the second stress is the other one of compressive stress and tensile stress.

With the above method, the first stressor insulating film is provided on the upper face and side faces facing in the gate length direction of the first gate electrode, and in addition, the second stressor insulating film is provided on the side faces of the first gate electrode facing in the gate width direction. Therefore, the first stress acts on the channel of the first MIS transistor in the gate length direction, and in addition, the second stress acts on the channel of the first MIS transistor in the gate width direction (i.e., the stress acts on the channel in the gate width direction with such an orientation that the drivability of the first MIS transistor is improved). Thus, the drivability of the first MIS transistor is further improved.

Preferably, the semiconductor device fabrication method according to one aspect of the present invention further includes, after step (a) but before step (b), step (e) of forming a first side wall between side faces of the first gate electrode facing in a gate length direction and the first stressor insulating film and between the side faces of the first gate electrode facing in the gate width direction and the first base insulating film.

Preferably, the semiconductor device fabrication method according to one aspect of the present invention further includes, after step (a) but before step (b), step (e) of forming a first side wall between side faces of the first gate electrode facing in a gate length direction and the first stressor insulating film and between the side faces of the first gate electrode facing in the gate width direction and the first base insulating film, wherein step (c) further includes removing part of the first side wall which exists on the side faces of the first gate electrode facing in the gate width direction.

With the above method, the first side wall does not exist between the side faces of the first gate electrode facing in the gate width direction and the first base insulating film. Therefore, when the second stressor insulating film is used as the first base insulating film, the second stress efficiently acts on the channel of the first MIS transistor in the gate width direction. Thus, the drivability of the first MIS transistor is further improved.

Preferably, the semiconductor device fabrication method according to one aspect of the present invention further includes (x) before step (a), forming an isolation region in the semiconductor substrate such that the first active region is surrounded by the isolation region; (e) after step (a) but before step (b), forming a first side wall between side faces of the first gate electrode facing in a gate length direction and the first stressor insulating film and between the side faces of the first gate electrode facing in the gate width direction and the first base insulating film; and (f) after step (e) but before step (b), removing part of the first side wall which exists over the isolation region.

With the above method, the side faces of the first gate electrode which exist over the isolation region are not covered with the first side wall. Therefore, when the second stressor insulating film is used as the first base insulating film, the second stress acts on the channel of the first MIS transistor in the gate width direction more efficiently.

In the semiconductor device fabrication method according to one aspect of the present invention, preferably, the semiconductor device further includes a second MIS transistor formed on a second active region of the semiconductor substrate; step (a) further includes sequentially forming a second gate insulating film and a second gate electrode on the second active region; and step (d) further includes forming a second base insulating film on the second gate electrode.

With the above method, a semiconductor device including both the first MIS transistor with improved drivability and the second MIS transistor is fabricated.

In the semiconductor device fabrication method according to one aspect of the present invention, preferably, the semiconductor device further includes a second MIS transistor formed on a second active region of the semiconductor substrate; step (a) further includes sequentially forming a second gate insulating film and a second gate electrode on the second active region; step (d) further includes forming a second base insulating film on the second gate electrode; step (d) includes forming as the second base insulating film a third stressor insulating film which causes third stress on a channel of the second MIS transistor which has the second gate electrode; and the third stressor insulating film and the second stressor insulating film are made of a same insulating film.

With the above method, the third stressor insulating film is provided on the second gate electrode. Therefore, the third stress acts on the channel of the second MIS transistor (i.e., the stress acts on the channel with such an orientation that the drivability of the second MIS transistor is improved). Thus, the drivability of the second MIS transistor is improved.

The semiconductor device fabrication method according to one aspect of the present invention preferably further includes, after step (a) but before step (b), step (e1) of forming a first side wall between side faces of the first gate electrode facing in a gate length direction and the first stressor insulating film and between the side faces of the first gate electrode facing in the gate width direction and the first base insulating film and step (e2) of forming a second side wall between side faces of the second gate electrode and the second base insulating film.

In the semiconductor device fabrication method according to one aspect of the present invention, preferably, the method further includes, before step (a), step (x) of forming an isolation region in the semiconductor substrate such that the isolation region separates the first active region and the second active region and that the second active region is surrounded by the isolation region; the method further includes, after step (a) but before step (b), step (e1) of forming a first side wall between side faces of the first gate electrode facing in a gate length direction and the first stressor insulating film and between the side faces of the first gate electrode facing in the gate width direction and the first base insulating film and step (e2) of forming a second side wall between side faces of the second gate electrode and the third stressor insulating film; and the method further includes, after steps (e1) and (e2) but before step (b), step (f1) of removing part of the first side wall which exists over the isolation region and step (f2) of removing part of the second side wall which exists over the isolation region.

With the above method, the side faces of the second gate electrode which exist over the isolation region are not covered with the second side wall. Therefore, the third stress efficiently acts on the channel of the second MIS transistor.

With the semiconductor device and fabrication method thereof according to one aspect of the present invention, the side faces of the first gate electrode facing in the gate width direction are not covered with the first stressor insulating film. Therefore, there is no probability that the first stress acts on the channel of the first MIS transistor in the gate width direction (i.e., there is no probability that the stress acts on the channel in the gate width direction with such an orientation that the drivability of the first MIS transistor is deteriorated). Thus, deterioration in drivability of the first MIS transistor is prevented.

In addition, with the semiconductor device and fabrication method thereof according to one aspect of the present invention, the first stressor insulating film is provided on the upper face and side faces facing in the gate length direction of the first gate electrode. Therefore, the first stress acts on the channel of the first MIS transistor in the gate length direction (i.e., the stress acts on the channel in the gate length direction with such an orientation that the drivability of the first MIS transistor is improved). Thus, the drivability of the first MIS transistor is improved.

BRIEF DESCRIPTION OF THE DRAWINGS

FIG. 18A and FIG. 18B are perspective views illustrating the orientation and size of stress with which the drivability of N-type and P-type MIS transistors is improved.

DESCRIPTION OF THE PREFERRED EMBODIMENTS

Hereinafter, embodiments of the present invention will be described with reference to the drawings.

Embodiment 1

Figure 1:
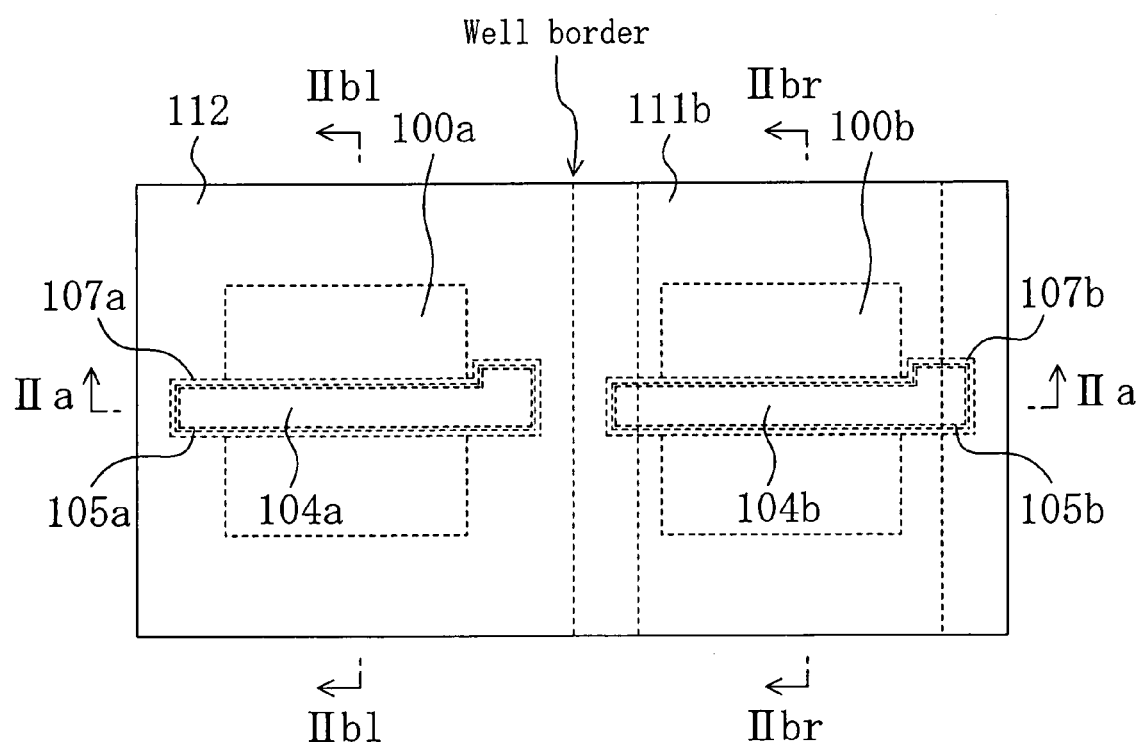
FIG. 1 is a plan view showing a structure of a semiconductor device according to embodiment 1 of the present invention.
Figure 2A:
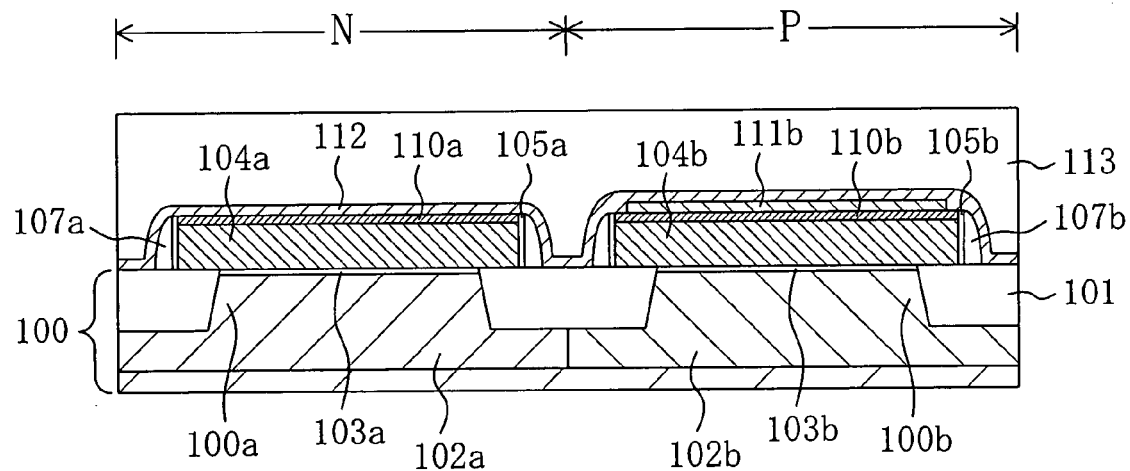
FIG. 2A and FIG. 2B are cross-sectional views showing the structure of the semiconductor device according to embodiment 1 of the present invention.
Figure 2B:
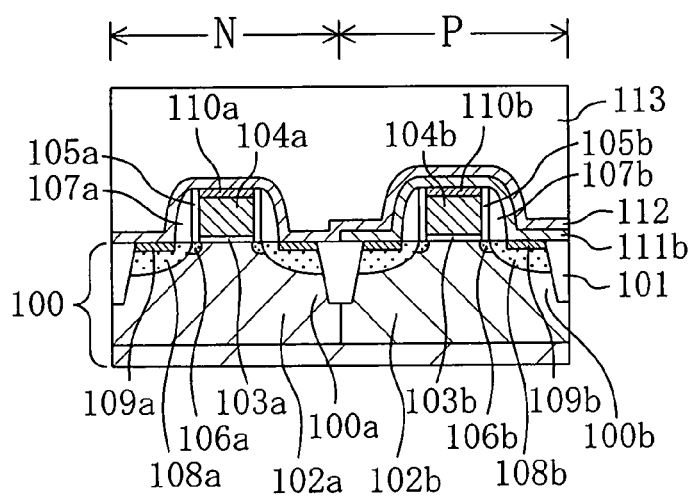

Hereinafter, a semiconductor device according to embodiment 1 of the present invention is described with reference to FIG. 1, FIG. 2A and FIG. 2B. FIG. 1 is a plan view showing the structure of the semiconductor device according to embodiment 1 of the present invention. It should be noted that the left half of the drawings shows an N-type MIS formation region, and the right half of the drawings shows a P-type MIS formation region. FIG. 2A and FIG. 2B are cross-sectional views showing the structure of the semiconductor device according to embodiment 1 of the present invention. Specifically, FIG. 2A is a cross-sectional view taken along line IIa-IIa of FIG. 1, i.e., a cross-sectional view taken along the gate width. The left part of FIG. 2B shows a cross section taken along line IIb1-IIb1 of FIG. 1, i.e., a cross-sectional view taken along the gate length. The right part of FIG. 2B shows a cross section taken along line IIbr-IIbr of FIG. 1, i.e., another cross-sectional view taken along the gate length. It should be noted that, in the drawings, indication "N" on the left part refers to the N-type MIS formation region, while indication "P" on the right part refers to the P-type MIS formation region.

Embodiment 1 is herein described specifically with an example where an N-type MIS transistor and a P-type MIS transistor are provided on a semiconductor substrate whose principal surface is (100) surface such that the gate length direction of the gate electrodes of the N-type and P-type transistors is set to <110> direction.

As shown in FIG. 1, the N-type MIS formation region includes an active region 100a which is part of the semiconductor substrate surrounded by an isolation region, while the P-type MIS formation region includes an active region 100b which is another part of the semiconductor substrate surrounded by the isolation region. A gate electrode 104a is provided on the active region 100a of the N-type MIS formation region with a gate insulating film interposed therebetween. A gate electrode 104b is provided on the active region 100b of the P-type MIS formation region with a gate insulating film interposed therebetween. The side faces of the gate electrodes 104a and 104b are covered with offset side walls 105a and 105b which in turn are covered with side walls 107a and 107b.

According to this embodiment, as shown in FIG. 1, a compressive stressor insulating film 111b is provided on the semiconductor substrate so as to cover the upper face and side faces facing in the gate length direction of the gate electrode 104b of the P-type MIS formation region. Also, a tensile stressor insulating film 112 is provided on the semiconductor substrate so as to cover the gate electrodes 104a and 104b. Herein, for example, the edges of the compressive stressor insulating film 111b at the width ends of the gate electrode 104b exist on the part of the gate electrode 104b lying over an isolation region 101 as shown in FIG. 1. It should be noted in this embodiment that the compressive stressor insulating film refers to an insulating film in which compressive stress occurs in the gate length direction in a channel region, and the tensile stress insulating film refers to an insulating film in which tensile stress occurs in the gate width direction in a channel region.

Referring to FIGS. 2A and 2B, the isolation region 101 which is formed by a silicon oxide film buried in a trench is selectively provided in the upper part of the semiconductor substrate 100. Thus, the N-type MIS formation region includes the active region 100a which is part of the semiconductor substrate 100 surrounded by the isolation region 101, while the P-type MIS formation region includes the active region 100b which is another part of the semiconductor substrate 100 surrounded by the isolation region 101. The N-type MIS formation region includes a P-type well region 102a in the semiconductor substrate 100, while the P-type MIS formation region includes an N-type well region 102b in the semiconductor substrate 100.

The gate electrode 104a is provided on the active region 100a of the N-type MIS formation region with a gate insulating film 103a interposed therebetween. The gate electrode 104b is provided on the active region 100b of the P-type MIS formation region with a gate insulating film 103b interposed therebetween. The side faces of the gate electrodes 104a and 104b are covered with offset side walls 105a and 105b which in turn are covered with side walls 107a and 107b.

Referring to FIG. 2B, part of the active region 100a of the N-type MIS formation region diagonally under the gate electrode 104a is an N-type extension region 106a, and another part of the active region 100a diagonally under the side wall 107a is an N-type source-drain region 108a. The N-type source-drain region 108a has a junction deeper than that of the N-type extension region 106a. Part of the active region 100b of the P-type MIS formation region diagonally under the gate electrode 104b is a P-type extension region 106b, and another part of the active region 100b diagonally under the side wall 107b is a P-type source-drain region 108b. The P-type source-drain region 108b has a junction deeper than that of the P-type extension region 106b.

Silicide films 109a and 109b are provided on the source-drain regions 108a and 108b, respectively. Silicide films 110a and 110b are provided on the gate electrodes 104a and 104b, respectively.

According to this embodiment, as shown in FIG. 2B, the compressive stressor insulating film 111b is provided on the semiconductor substrate 100 so as to cover the upper face and side faces facing in the gate length direction of the gate electrode 104b of the P-type MIS formation region. It should be noted, however, that the compressive stressor insulating film 111b does not cover the faces of the gate electrode 104b facing in the gate width direction as shown in FIG. 2A. Also, the tensile stressor insulating film 112 is provided on the semiconductor substrate 100 so as to cover the gate electrodes 104a and 104b. An interlayer insulating film 113 is provided on the tensile stressor insulating film 112.

As described above, according to this embodiment, in the P-type MIS formation region, the upper face and side faces facing in the gate length direction of the gate electrode 104b are covered with the compressive stressor insulating film 111b which in turn is covered with the tensile stressor insulating film 112. The side faces facing in the gate width direction of the gate electrode 104b are covered with the tensile stressor insulating film 112.

In the N-type MIS formation region, all of the upper face, side faces facing in the gate length direction, and side faces facing in the gate width direction of the gate electrode 104a are covered with the tensile stressor insulating film 112.

Hereinafter, a semiconductor device fabrication method according to embodiment 1 of the present invention is described with reference to FIG. 3A through FIG. 3C, FIG. 4A through FIG. 4C, FIG. 5A through FIG. 5C, FIG. 6A through FIG. 6C, FIG. 7A through FIG. 7C, and FIG. 8A through FIG. 8C. FIG. 3A through FIG. 3C, FIG. 4A through FIG. 4C, and FIG. 5A through FIG. 5C are cross-sectional views illustrating the steps of the semiconductor device fabrication method according to embodiment 1 of the present invention, which show the principal part of a semiconductor device along the gate width. It should be noted that indication "N" on the left part refers to the N-type MIS formation region, while indication "P" on the right part refers to the P-type MIS formation region. FIG. 6A through FIG. 6C, FIG. 7A through FIG. 7C, and FIG. 8A through FIG. 8C are cross-sectional views illustrating the steps of the semiconductor device fabrication method according to embodiment 1 of the present invention, which show the principal part of the semiconductor device along the gate length. For simplicity of illustration in the drawings, N-type MIS formation region N is shown on the left side, and P-type MIS formation region P is shown on the right side. Herein, the steps of FIG. 3A through FIG. 3C, FIG. 4A through FIG. 4C, and FIG. 5A through FIG. 5C correspond to the steps of FIG. 6A through FIG. 6C, FIG. 7A through FIG. 7C, and FIG. 8A through FIG. 8C, respectively. Thus, the following descriptions are provided for every pair of corresponding steps.

Figure 3A:
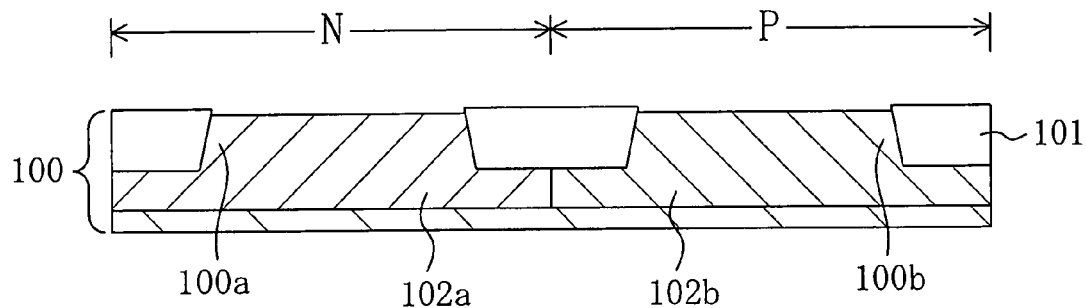
FIG. 3A through FIG. 3C are cross-sectional views illustrating the steps of a semiconductor device fabrication method according to embodiment 1 of the present invention, which show the principal part of the semiconductor device along the gate width.
Figure 6A:
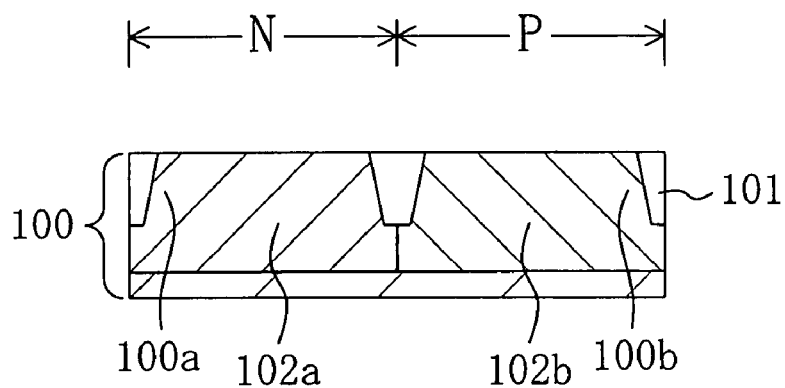
FIG. 6A through FIG. 6C are cross-sectional views illustrating the steps of the semiconductor device fabrication method according to embodiment 1 of the present invention, which show the principal part of the semiconductor device along the gate length.

First, referring to FIG. 3A and FIG. 6A, an isolation region 101 is selectively formed on a semiconductor substrate 100 made of P-type silicon by burying a silicon oxide film in a trench using a Shallow Trench Isolation (STI) method. As a result, the N-type MIS formation region includes an active region 100a which is part of the semiconductor substrate 100 surrounded by the isolation region 101, while the P-type MIS formation region includes an active region 100b which is another part of the semiconductor substrate 100 surrounded by the isolation region 101. Thereafter, a P-type impurity, for example, boron (B), is implanted in the P-type MIS formation region of the semiconductor substrate 100 to form a P-type well region 102a, while an N-type impurity, for example, arsenic (As), is implanted in the N-type MIS formation region of the semiconductor substrate 100 to form an N-type well region 102b.

Figure 3B:
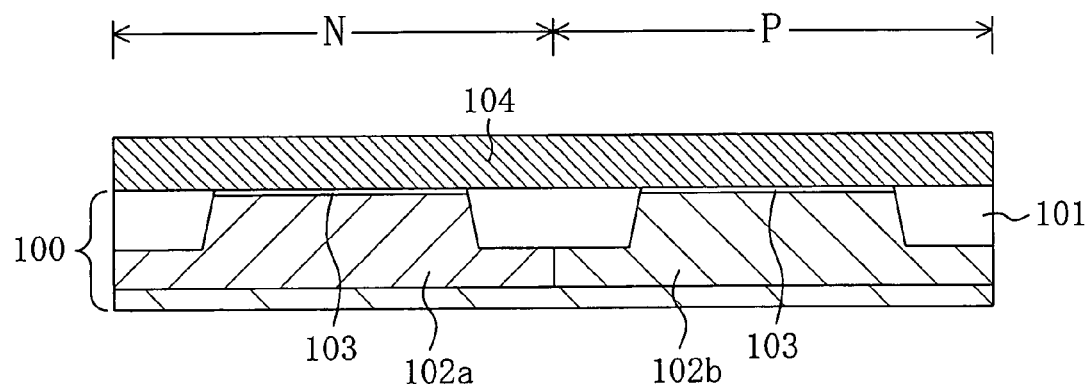
Figure 6B:
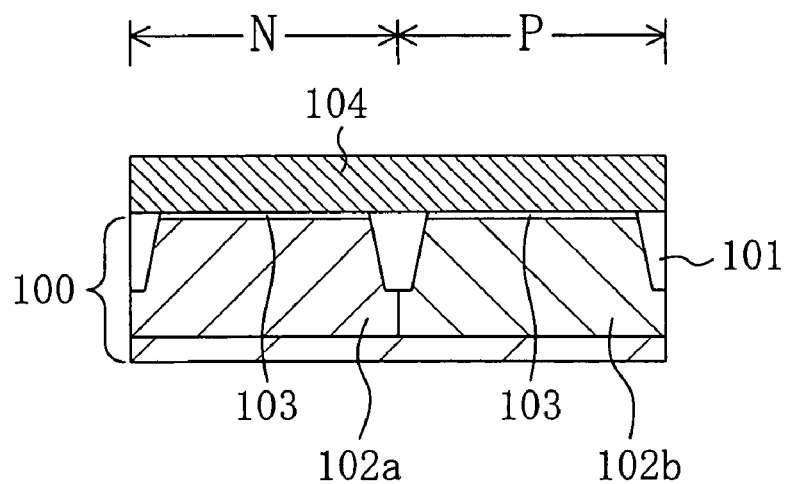

Then, referring to FIG. 3B and FIG. 6B, a silicon oxide film 103 (which will later be gate insulating films) is formed by, for example, thermal oxidation over the surface of the semiconductor substrate 100. Over the silicon oxide film 103, a polysilicon film 104 (which will later be gate electrodes) is formed to a thickness of 140 nm.

Figure 3C:
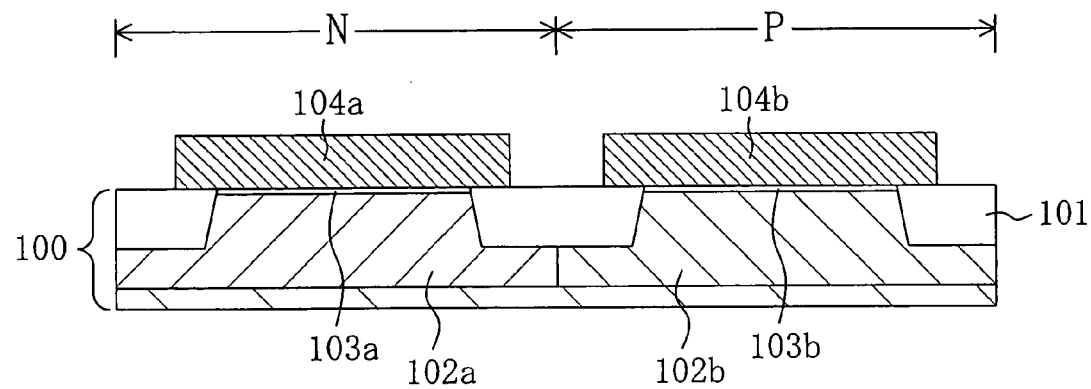
Figure 6C:
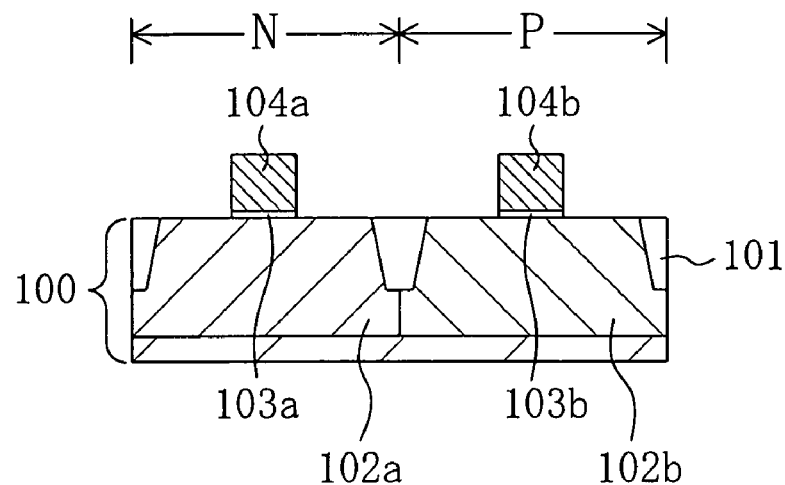

Then, referring to FIG. 3C and FIG. 6C, a resist film (not shown) having a gate pattern shape is formed over the polysilicon film 104. The resist film is then used as a mask to sequentially etch away the parts of the polysilicon film 104 and silicon oxide film 103 exposed through the openings of the resist film, and the resist film is removed after the etching process. As a result, as shown in FIG. 3C and FIG. 6C, a gate electrode 104a having the gate pattern shape is formed on the active region 100a of the N-type MIS formation region with a gate insulating film 103a interposed therebetween, while a gate electrode 104b having the gate pattern shape is formed on the active region 100b of the P-type MIS formation region with a gate insulating film 103b interposed therebetween.

Figure 4A:
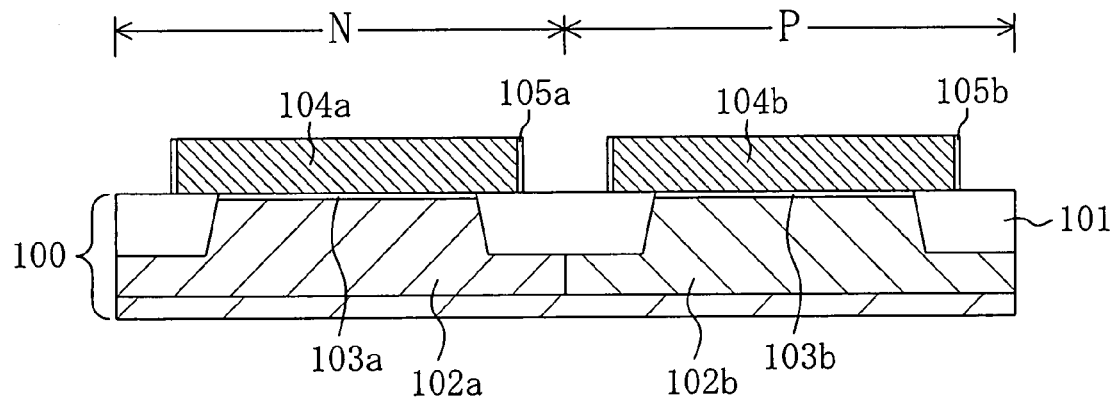
FIG. 4A through FIG. 4C are cross-sectional views illustrating the steps of the semiconductor device fabrication method according to embodiment 1 of the present invention, which show the principal part of the semiconductor device along the gate width.
Figure 7A:
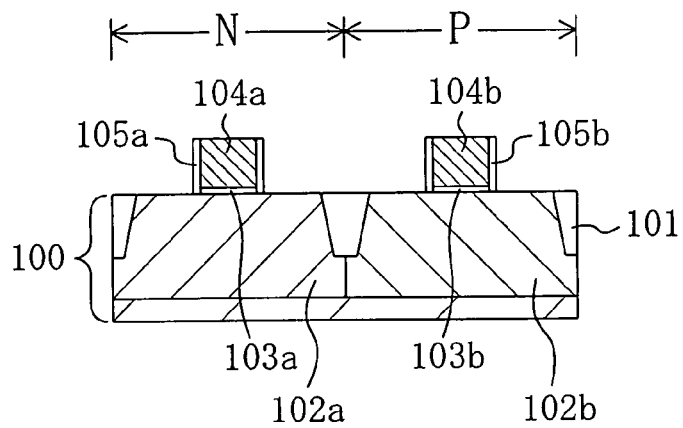
FIG. 7A through FIG. 7C are cross-sectional views illustrating the steps of the semiconductor device fabrication method according to embodiment 1 of the present invention, which show the principal part of the semiconductor device along the gate length.

Then, referring to FIG. 4A and FIG. 7A, a silicon oxide film is formed by CVD to a thickness of, for example, 14 nm entirely over the semiconductor substrate 100 so as to cover the gate electrodes 104a and 104b. The silicon oxide film is then etched using an etch-back method to form offset side walls 105a and 105b of silicon oxide over the side faces of the gate electrodes 104a and 104b.

Figure 4B:
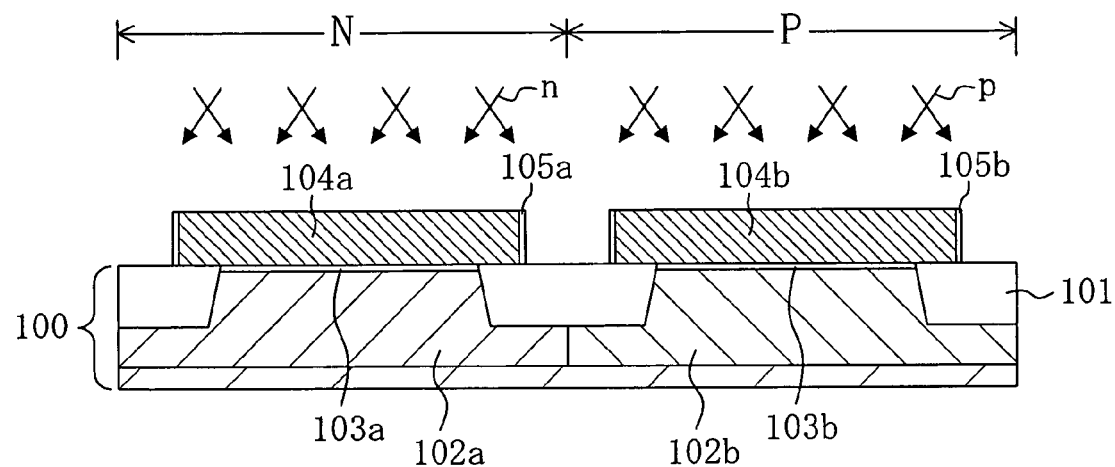
Figure 7B:
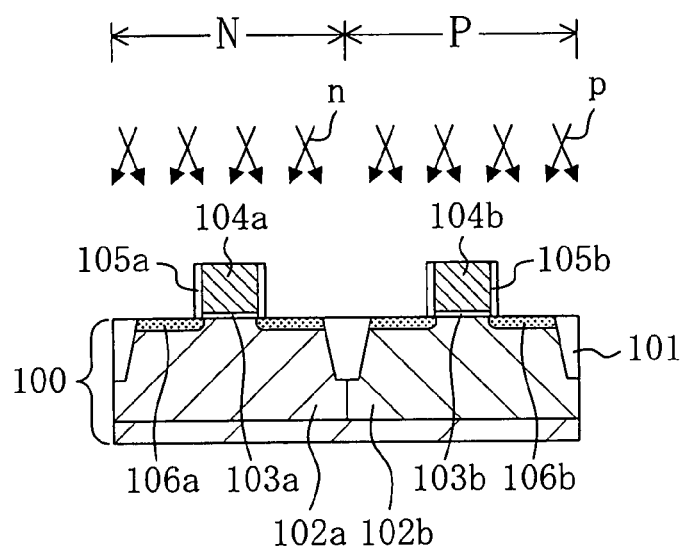

Then, referring to FIG. 4B and FIG. 7B, an N-type impurity, for example, arsenic (As), is ion-implanted in the active region 100a of the N-type MIS formation region using the offset side wall 105a and gate electrode 104a as masks, such that an N-type extension region 106a (see, in particular, FIG. 7B) is formed in a self-alignment manner in the part of the active region 100a diagonally under the gate electrode 104a. Meanwhile, a P-type impurity, for example, boron (B), is ion-implanted in the active region 100b of the P-type MIS formation region using the offset side wall 105b and gate electrode 104b as masks, such that a P-type extension region 106b (see, in particular, FIG. 7B) is formed in a self-alignment manner in the part of the active region 100b diagonally under the gate electrode 104b.

Figure 4C:
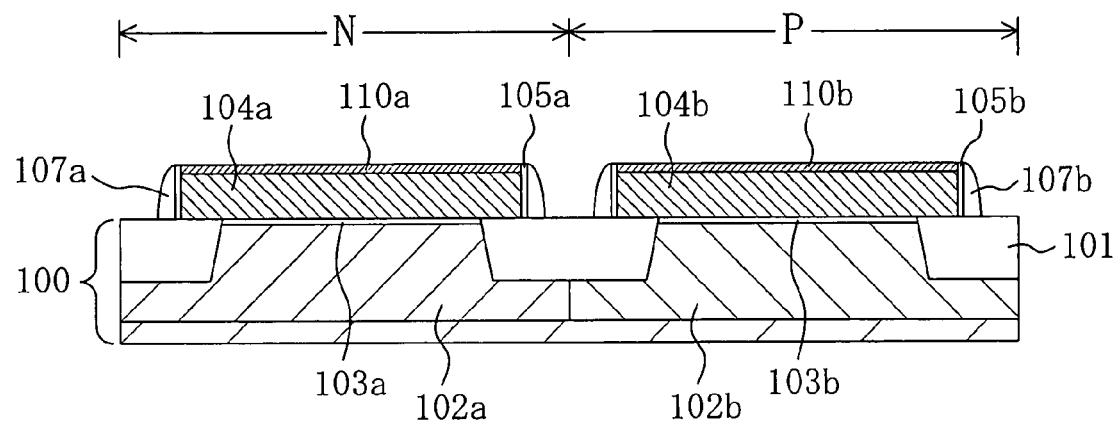
Figure 7C:
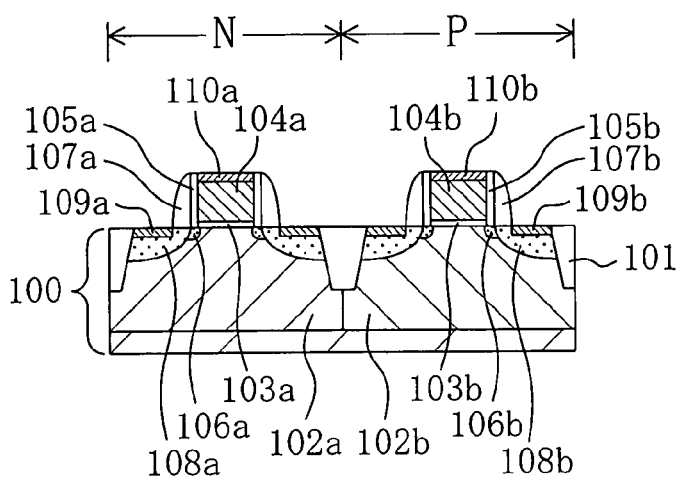

Then, referring to FIG. 4C and FIG. 7C, a silicon nitride film is formed by CVD to a thickness of, for example, 65 nm entirely over the semiconductor substrate 100 so as to cover the gate electrodes 104a and 104b. The silicon nitride film is then etched using an etch-back method to form side walls 107a and 107b of silicon nitride over the side faces of the offset side walls 105a and 105b. Then, an N-type impurity, for example, arsenic (As), is ion-implanted in the active region 100a of the N-type MIS formation region using the side wall spacer 107a and gate electrode 104a as masks, such that an N-type source-drain region 108a (see, in particular, FIG. 7C) is formed in a self-alignment manner in the part of the active region 100a diagonally under the side wall spacer 107a. The impurity concentration of the N-type source-drain region 108a is higher than that of the N-type extension region 106a. Meanwhile, a P-type impurity, for example, boron (B), is ion-implanted in the active region 100b of the P-type MIS formation region using the side wall spacer 107b and gate electrode 104b as masks, such that a P-type source-drain region 108b (see, in particular, FIG. 7C) is formed in a self-alignment manner in the part of the active region 100b diagonally under the side wall spacer 107b. The impurity concentration of the P-type source-drain region 108b is higher than that of the P-type extension region 106b. Thereafter, the resultant structure is subjected to a thermal treatment at 1000° C. during a very short time period, whereby the conductive impurities contained in the source-drain regions 108a and 108b are activated.

Thereafter, a metal film of, for example, Ni, Co or Ti (not shown) is deposited by sputtering entirely over the semiconductor substrate 100 so as to cover the gate electrodes 104a and 104b. Then, a thermal treatment is performed to cause a reaction of Si contained in the source-drain regions 108a and 108b and gate electrodes 104a and 104b and the metal contained in the metal film, such that metal silicidation occurs in each of the source-drain regions 108a and 108b and gate electrodes 104a and 104b. Thus, in the N-type MIS formation region, the reaction of the upper part of the N-type source-drain region 108a and the metal film leads to formation of a silicide film 109a of metal silicide (see, in particular, FIG. 7C), while the reaction of the upper part of the gate electrode 104a and the metal film leads to formation of a silicide film 110a of metal silicide. In the P-type MIS formation region, the reaction of the upper part of the P-type source-drain region 108b and the metal film leads to formation of a silicide film 109b of metal silicide (see, in particular, FIG. 7C), while the reaction of the upper part of the gate electrode 104b and the metal film leads to formation of a silicide film 110b of metal silicide.

Figure 5A:
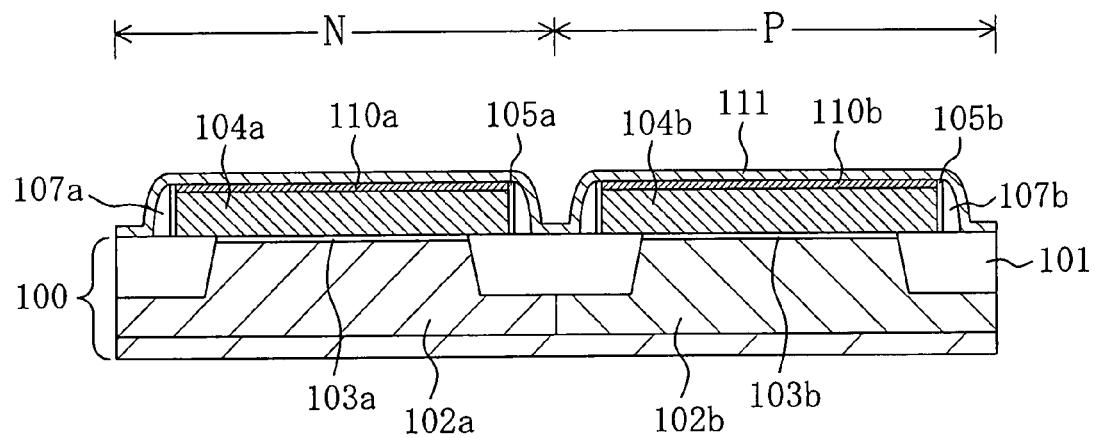
FIG. 5A through FIG. 5C are cross-sectional views illustrating the steps of the semiconductor device fabrication method according to embodiment 1 of the present invention, which show the principal part of the semiconductor device along the gate width.
Figure 8A:
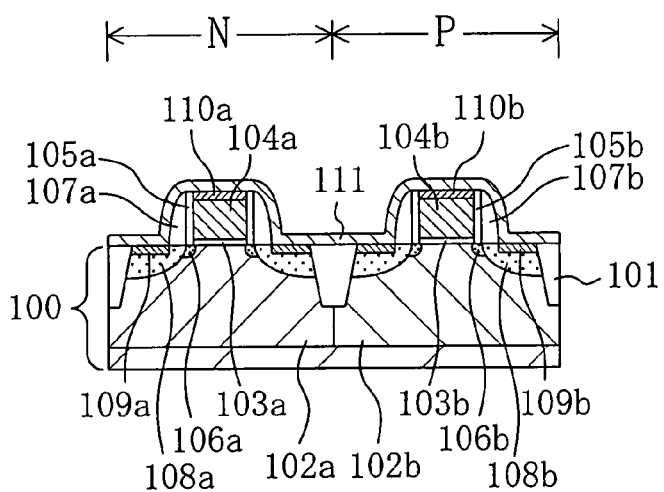
FIG. 8A through FIG. 8C are cross-sectional views illustrating the steps of the semiconductor device fabrication method according to embodiment 1 of the present invention, which show the principal part of the semiconductor device along the gate length.

Then, referring to FIG. 5A and FIG. 8A, a compressive stressor insulating film 111 is formed of silicon nitride to a thickness of 30 nm by, for example, PECVD (Plasma Enhanced Chemical Vapor Deposition) entirely over the semiconductor substrate 100 so as to cover the gate electrodes 104a and 104b.

Figure 5B:
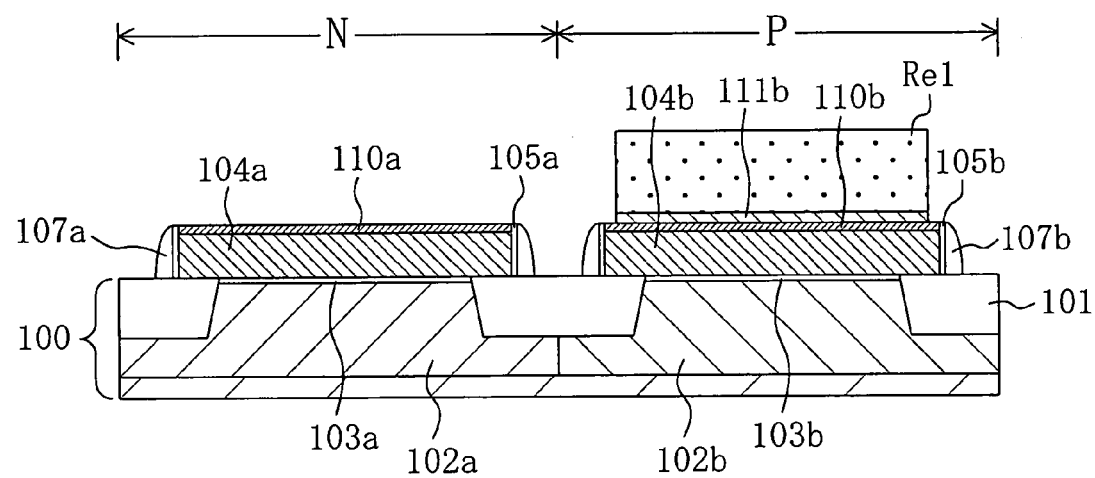
Figure 8B:
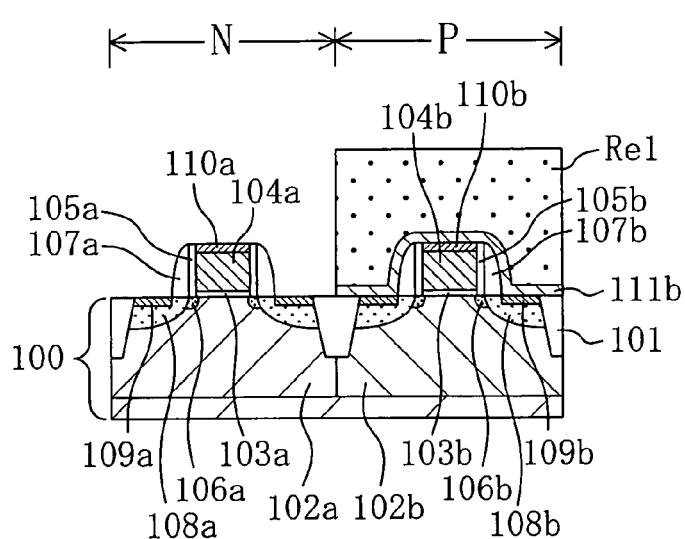

Then, referring to FIG. 5B and FIG. 8B, a resist film Re1 is formed over the compressive stressor insulating film 111 such that the resist film Re1 has an opening entirely over the N-type MIS formation region while the P-type MIS formation region is partially covered with the resist film Re1. Then, the resist film Re1 is used as a mask to etch away the part of the compressive stressor insulating film 111 exposed through an opening of the resist film Re1, and then, the resist film Re1 is removed. In this way, the part of the compressive stressor insulating film 111 which exists in the N-type MIS formation region and the part of the compressive stressor insulating film 111 which exists on the side faces facing in the gate width direction of the gate electrode 104b of the P-type MIS formation region are removed. As a result, the compressive stressor insulating film 111b remains on the upper face and side faces facing in the gate length direction of the gate electrode 104b of the P-type MIS formation region.

Figure 5C:
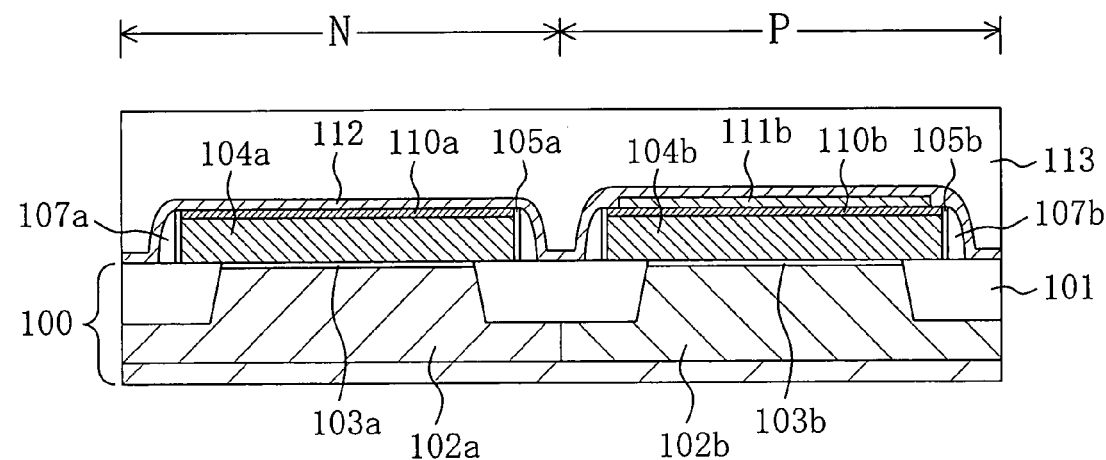
Figure 8C:
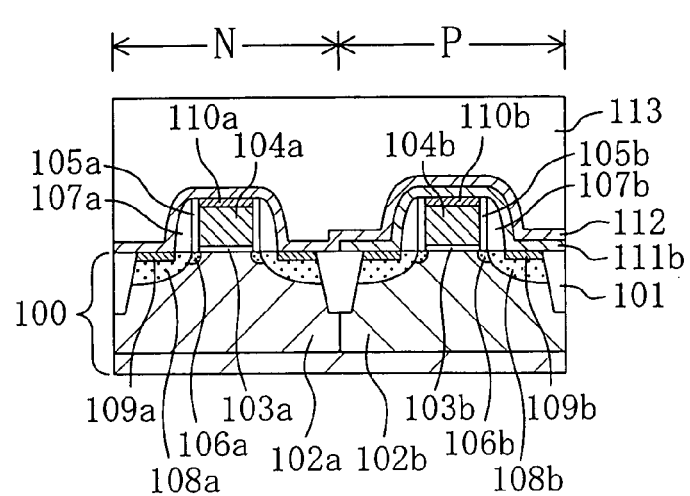

Then, referring to FIG. 5C and FIG. 8C, a tensile stressor insulating film 112 is formed of silicon nitride by, for example, LPCVD (Low Pressure Chemical Vapor Deposition) to a thickness of 30 nm entirely over the semiconductor substrate 100 so as to cover the gate electrodes 104a and 104b. Then, an interlayer insulating film 113 is formed by, for example, CVD over the tensile stressor insulating film 112, and the surface of the interlayer insulating film 113 is planarized by CMP.

Then, in the same manner as the commonly-employed fabrication method for semiconductor devices having MIS transistors, a contact hole (not shown) is formed in the tensile stressor insulating film 112 and the interlayer insulating film 113 so as to reach the silicide films 109a and 110a of the N-type MIS formation region, while a contact hole (not shown) is formed in the compressive stressor insulating film 111b, the tensile stressor insulating film 112 and the interlayer insulating film 113 so as to reach the silicide films 109b and 110b of the P-type MIS formation region. Then, a barrier metal film (not shown) is formed on the bottom and side wall of each contact hole, and a metal film is then buried in each contact hole. In this way, a contact plug (not shown) is obtained wherein the metal film fills the contact hole with the barrier metal film interposed therebetween. Thereafter, a metal wire (not shown) is formed on the interlayer insulating film 113 so as to be electrically connected with the contact plug.

As described above, the semiconductor device of this embodiment is thus fabricated.

Herein, in this embodiment, the gate length direction of the gate electrode is set to <110> direction, and therefore, in a P-type MIS transistor, the orientation of the stress (tensile or compressive) with which the drivability of the P-type MIS transistor is improved differs between the gate length direction and the gate width direction. Specifically, as shown in FIG. 18A, compressive stress is necessary in the gate length direction, while tensile stress is necessary in the gate width direction.

Under such circumstances, according to this embodiment, as shown in FIG. 1 and FIGS. 2A and 2B, the compressive stressor insulating film 111b is provided over the upper face and side faces facing in the gate length direction of the gate electrode 104b of the P-type MIS formation region, while the tensile stressor insulating film 112 is provided over the side faces facing in the gate width direction of the gate electrode 104b.

According to this embodiment, the side faces facing in the gate width direction of the gate electrode 104b of the P-type MIS formation region are not covered with the compressive stressor insulating film 111b. Therefore, there is no probability that compressive stress acts on the channel of the P-type MIS transistor in the gate width direction. Thus, deterioration in drivability of the P-type MIS transistor is prevented. In addition, since the compressive stressor insulating film 111b is provided over the upper face and side faces facing in the gate length direction of the gate electrode 104b, compressive stress acts on the channel of the P-type MIS transistor in the gate length direction. Thus, the drivability of the P-type MIS transistor is improved.

According to this embodiment, the compressive stressor insulating film 111b is provided over the upper face and side faces facing in the gate length direction of the gate electrode 104b of the P-type MIS formation region, and in addition, the tensile stressor insulating film 112 is provided over the side faces of the gate electrode 104b facing in the gate width direction. With this structure, compressive stress acts on the channel of the P-type MIS transistor in the gate length direction while tensile stress acts on the channel in the gate width direction. Thus, the drivability of the P-type MIS transistor is further improved.

Since in this embodiment the gate length direction of the gate electrode is set to <110> direction, the N-type MIS transistor requires tensile stress in both gate length direction and gate width direction for improving the drivability of the N-type MIS transistor as illustrated in FIG. 18A. In this embodiment, tensile stress acts in both gate length direction and gate width direction on the channel of the N-type MIS transistor because the tensile stressor insulating film 112 is provided over the upper face, side faces facing in the gate length direction, and side faces facing in the gate width direction of the gate electrode 104a of the N-type MIS formation region. Thus, the drivability of the N-type MIS transistor is improved.

In the example specifically described for this embodiment, the tensile stressor insulating film 112 is used, but the present invention is not limited thereto. For example, a stress-free base insulating film may be used in place of the tensile stressor insulating film 112.

With such a structure, in the channel of the P-type MIS transistor, compressive stress occurs only in the gate length direction without occurrence of compressive stress in the gate width direction, although tensile stress does not act in the gate width direction. Therefore, deterioration in drivability of the P-type MIS transistor is prevented while the drivability of the P-type MIS transistor is improved.

—First Variation—

Figure 9A:
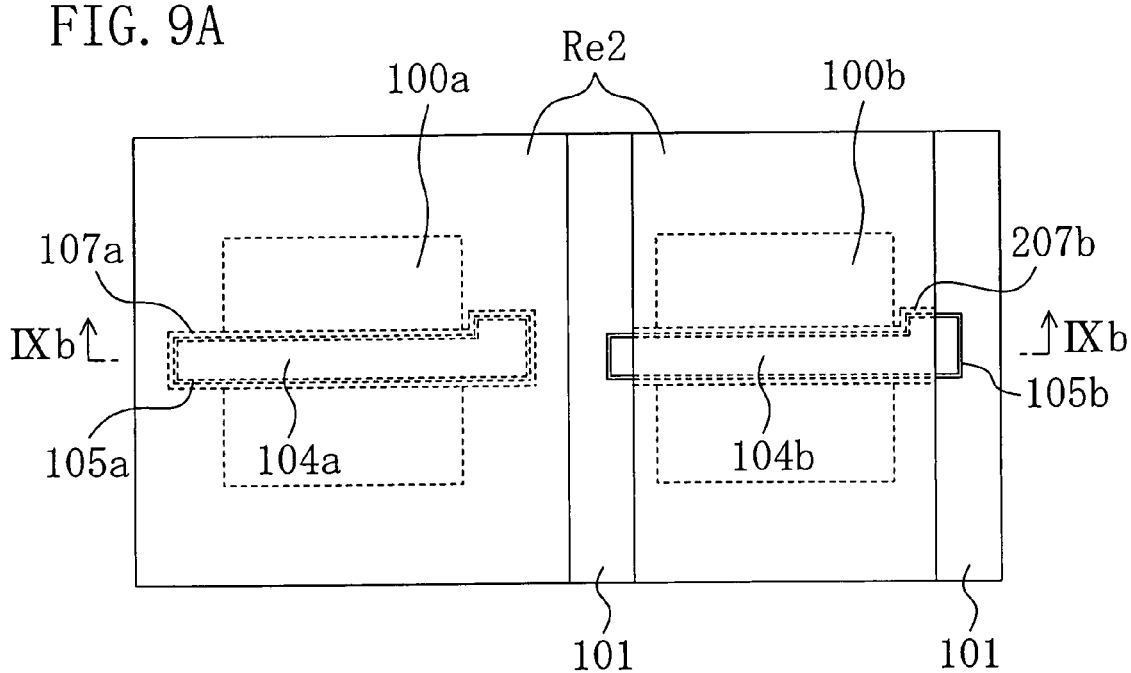
FIG. 9A is a plan view for illustrating a semiconductor device fabrication method according to the first variation of the present invention, which shows the principal part of the semiconductor device.
Figure 9B:
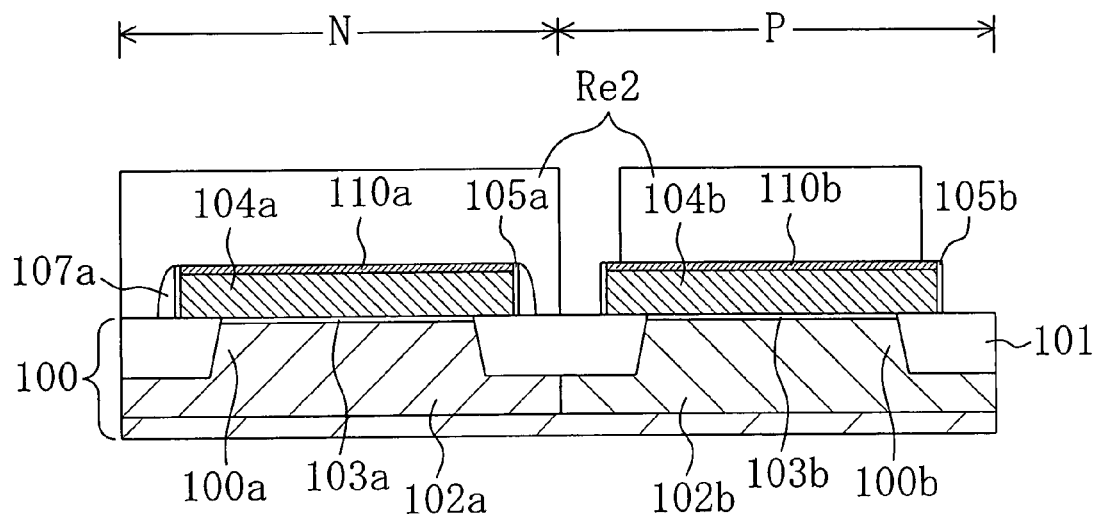
FIG. 9B is a cross-sectional view for illustrating the semiconductor device fabrication method according to the first variation of the present invention, which shows the principal part of the semiconductor device along the gate width.

Hereinafter, a semiconductor device fabrication method according to the first variation of the present invention is described with reference to FIG. 9A and FIG. 9B. FIG. 9A is a plan view for illustrating a semiconductor device fabrication method according to the first variation of the present invention, which shows the principal part of the semiconductor device. FIG. 9B is a cross-sectional view for illustrating the semiconductor device fabrication method according to the first variation of the present invention, which shows the principal part of the semiconductor device. Specifically, FIG. 9B is a cross-sectional view taken along line IXb-IXb of FIG. 9A, i.e., along the gate width. It should be noted that the left half of the drawings shows an N-type MIS formation region, and the right half of the drawings shows a P-type MIS formation region. In FIG. 9A and FIG. 9B, components equivalent to those of the semiconductor device of embodiment 1 are denoted by the same reference numerals. Therefore, the same descriptions as those of embodiment 1 are not repeated herein for the first variation.

After sequentially performing the processes of steps illustrated in FIG. 3A through FIG. 3C and FIG. 6A through FIG. 6C, FIG. 4A through FIG. 4C and FIG. 7A through FIG. 7C, and FIGS. 5A and 5B and FIGS. 8A and 8B, a resist film Re2 is formed on the semiconductor substrate such that the resist film Re2 entirely covers the N-type MIS formation region and has an opening in part of the P-type MIS formation region as shown in FIG. 9A and FIG. 9B. Thereafter, the parts of the side wall which are exposed through the openings of the resist film Re2 are removed, and then, the resist film Re2 is removed. In such a way, the side wall covering the side faces facing in the gate width direction of the gate electrode 104b of the P-type MIS formation region is removed such that the offset side wall 105b is exposed, while the side wall 207b remains over the side faces facing in the gate length direction of the gate electrode 104b with the offset side wall 105b interposed therebetween.

Then, as in the step of FIG. 5C and FIG. 8C, a tensile stressor insulating film is formed by LPCVD entirely over the semiconductor substrate so as to cover the gate electrodes 104a and 104b. In this step, the tensile stressor insulating film is formed over the side faces facing in the gate width direction of the gate electrode 104b of the P-type MIS formation region with the offset side wall 105b interposed therebetween. Then, as in embodiment 1, the steps equivalent to those of the commonly-employed fabrication method for semiconductor devices having MIS transistors are sequentially carried out, such that the semiconductor device according to this variation is fabricated.

Herein, the differences between embodiment 1 and the first variation of the present invention are described below.

In this variation, no side wall is provided over the side faces facing in the gate width direction of the gate electrode 104b of the P-type MIS formation region such that the tensile stressor insulating film 112 is provided over the side faces with the offset side wall 105b interposed therebetween, whereas in embodiment 1 the tensile stressor insulating film 112 is provided over the side faces facing in the gate width direction of the gate electrode 104b of the P-type MIS formation region with the offset side wall 105b and side wall 107b interposed therebetween (see FIG. 2A).

According to this variation, the tensile stressor insulating film is provided over the side faces facing in the gate width direction of the gate electrode 104b of the P-type MIS formation region with the offset side wall 105b interposed therebetween (side wall has been previously removed). With this structure, tensile stress efficiently acts on the channel of the P-type MIS transistor in the gate width direction. Thus, the drivability of the P-type MIS transistor is further improved.

Namely, according to this variation, the side wall 107b interposed between the side faces of the gate electrode 104b facing in the gate width direction and the tensile stressor insulating film 112 prevents relaxation of the tensile stress acting on the channel of the P-type MIS transistor in the gate width direction as in embodiment 1.

Thus, in this variation, the drivability of the P-type MIS transistor is further improved as compared with embodiment 1.

In this variation, as for the offset side wall and side wall formed on the side faces facing in the gate width direction of the gate electrode 104b of the P-type MIS formation region, only the side wall is removed, but the exposed offset side wall may also be removed such that the side faces of the gate electrode 104b facing in the gate width direction are exposed. In this case, when forming a tensile stressor insulating film, the tensile stressor insulating film can be formed directly on the side faces of the gate electrode 104b facing in the gate width direction. Therefore, tensile stress acts more efficiently on the channel of the P-type MIS transistor in the gate width direction as compared with the first variation.

-Second Variation-

Figure 10A:
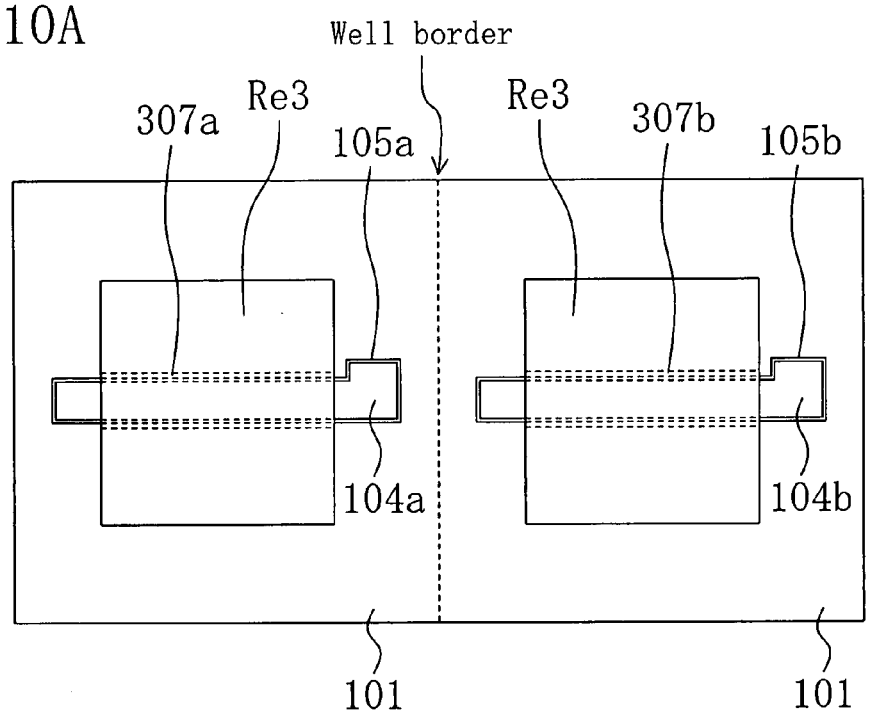
FIG. 10A and FIG. 10B are plan views for illustrating a semiconductor device fabrication method according to the second variation of the present invention, which show the principal part of the semiconductor device.
Figure 10B:
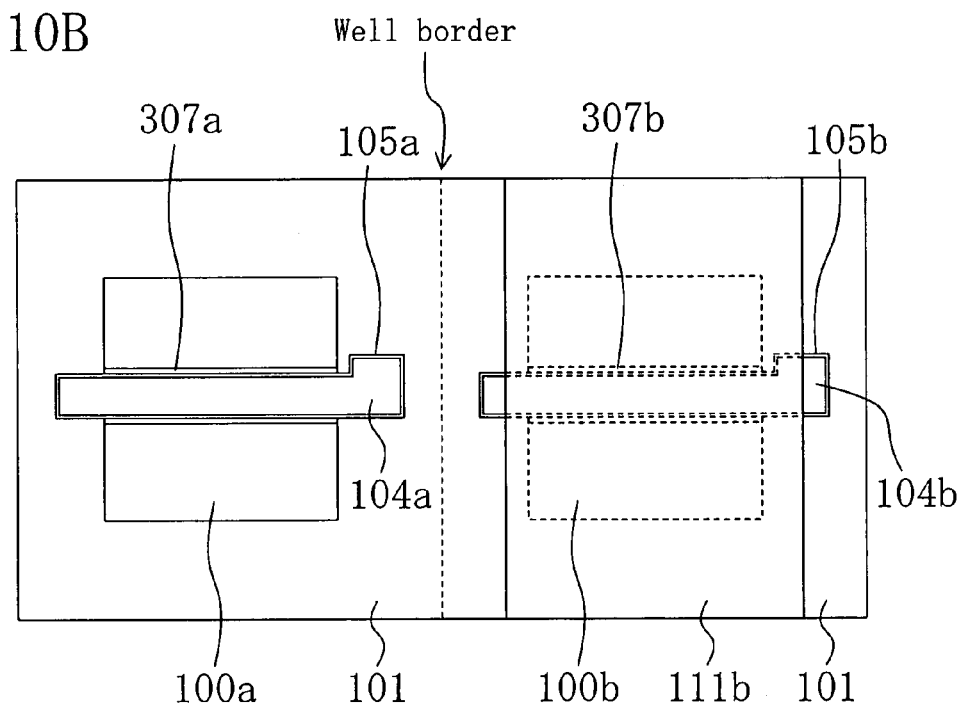

Hereinafter, a semiconductor device fabrication method according to the second variation of the present invention is described with reference to FIG. 10A and FIG. 10B. FIG. 10A and FIG. 10B are plan views for illustrating the semiconductor device fabrication method according to the second variation of the present invention, which show the principal part of the semiconductor device. It should be noted that the left half of the drawings shows an N-type MIS formation region, and the right half of the drawings shows a P-type MIS formation region.

After sequentially performing the processes of steps illustrated in FIG. 3A through FIG. 3C and FIG. 6A through FIG. 6C and FIG. 4A through FIG. 4C and FIG. 7A through FIG. 7C, a resist film Re3 is formed on the semiconductor substrate such that the resist film Re3 covers the active region of the N-type MIS formation region and the active region of the P-type MIS formation region and has openings over the isolation region 101 of the N-type MIS formation region and the isolation region 101 of the P-type MIS formation region as shown in FIG. 10A. Herein, for example, the resist film used for the formation of the trench in the semiconductor substrate 100 at the step of FIG. 3A and FIG. 6A is employed as the resist film Re3. Thereafter, the part of the side wall exposed through the opening of the resist film Re3 is removed, and then, the resist film Re3 is removed. In this variation, the side wall removal step occurs between formation of the silicide film and formation of the compressive stressor insulating film but may occur between formation of the side wall and formation of the source-drain regions or between formation of the source-drain regions and formation of the silicide film.

In this way, the part of the side wall lying over the isolation region 101 is removed, such that the side walls 307a and 307b remain on the side faces of the parts of the gate electrodes 104a and 104b which exist over the active regions with the offset side walls 105a and 105b interposed therebetween.

Then, as in the step of FIG. 5A and FIG. 8A, a compressive stressor insulating film is formed of silicon nitride to a thickness of 30 nm by PECVD entirely over the semiconductor substrate so as to cover the gate electrodes 104a and 104b. In this step, the compressive stressor insulating film is formed over the side faces of the parts of the gate electrodes 104a and 104b which exist over the isolation region 101 with the offset side walls 105a and 105b interposed therebetween.

Then, as in the step of FIG. 5B and FIG. 8B, a resist film is formed over the semiconductor substrate such that the resist film has an opening entirely over the N-type MIS formation region while the P-type MIS formation region is partially covered with the resist film. Thereafter, the parts of the compressive stressor insulating film exposed through openings of the resist film are removed, and then, the resist film is removed. In this way, as illustrated in FIG. 10B, the offset side wall 105b provided over the side faces facing in the gate width direction of the gate electrode 104b of the P-type MIS formation region is exposed, while the compressive stressor insulating film 111b remains over the upper face and side faces facing in the gate length direction of the gate electrode 104b.

Then, as in the step of FIG. 5C and FIG. 8C, a tensile stressor insulating film is formed by, for example, LPCVD entirely over the semiconductor substrate so as to cover the gate electrodes 104a and 104b. In this step, the tensile stressor insulating film is formed over the side faces facing in the gate width direction of the gate electrodes 104a and 104b with the offset side walls 105a and 105b interposed therebetween. Then, as in embodiment 1, the steps equivalent to those of the commonly-employed fabrication method for semiconductor devices having MIS transistors are sequentially carried out, such that the semiconductor device according to this variation is fabricated.

Herein, the differences between the first variation and the second variation of the present invention are described below.

In the second variation, a side wall 307b does not remain over the isolation region 101 of the P-type MIS formation region but is provided only on the active region 100b whereas in the first variation the side wall 207b remains on the isolation region 101 of the P-type MIS formation region. Herein, in the second variation, the side faces of the parts of the gate electrodes 104a and 104b which exist over the active regions 100a and 100b are covered with the offset side walls 105a and 105b which in turn are covered with the side walls 307a and 307b. Therefore, this structure does not cause any adverse effect on the characteristics of the N-type and P-type MIS transistors.

According to this variation, the tensile stressor insulating film is provided over the side faces facing in the gate width direction of the gate electrode 104b of the P-type MIS formation region with the offset side wall 105b interposed therebetween. In addition, the side wall 307b does not remain on the side faces of the gate electrode 104b over the isolation region. With this structure, tensile stress acts more efficiently on the channel of the P-type MIS transistor in the gate width direction.

Thus, in the second variation, the drivability of the P-type MIS transistor is further improved as compared with the first variation.

In addition, according to the second variation, the tensile stressor insulating film is provided over the side faces of the part of the gate electrode 104a of the N-type MIS formation region which exists over the isolation region 101 with the offset side wall 105a interposed between the tensile stressor insulating film and the side faces (side wall has been previously removed). With this structure, tensile stress efficiently acts on the channel of the N-type MIS transistor in both gate length direction and gate width direction. Thus, the drivability of the N-type MIS transistor is further improved.

It should be noted that, in the specific example described above for the second variation, the resist film used for the formation of the trench in the semiconductor substrate 100 is employed as the resist film Re3 with the view of entirely removing the part of the side wall 107b formed on the isolation region 101. However, the present invention is not limited to this example.

It should be noted that, in the second variation, as for the offset side wall and side wall formed on the isolation region 101, only the side wall is removed. However, the offset side wall may also be removed. In this case, tensile stress acts more efficiently on the channel of the P-type MIS transistor in the gate width direction as compared with the second variation.

Embodiment 2

Figure 11:
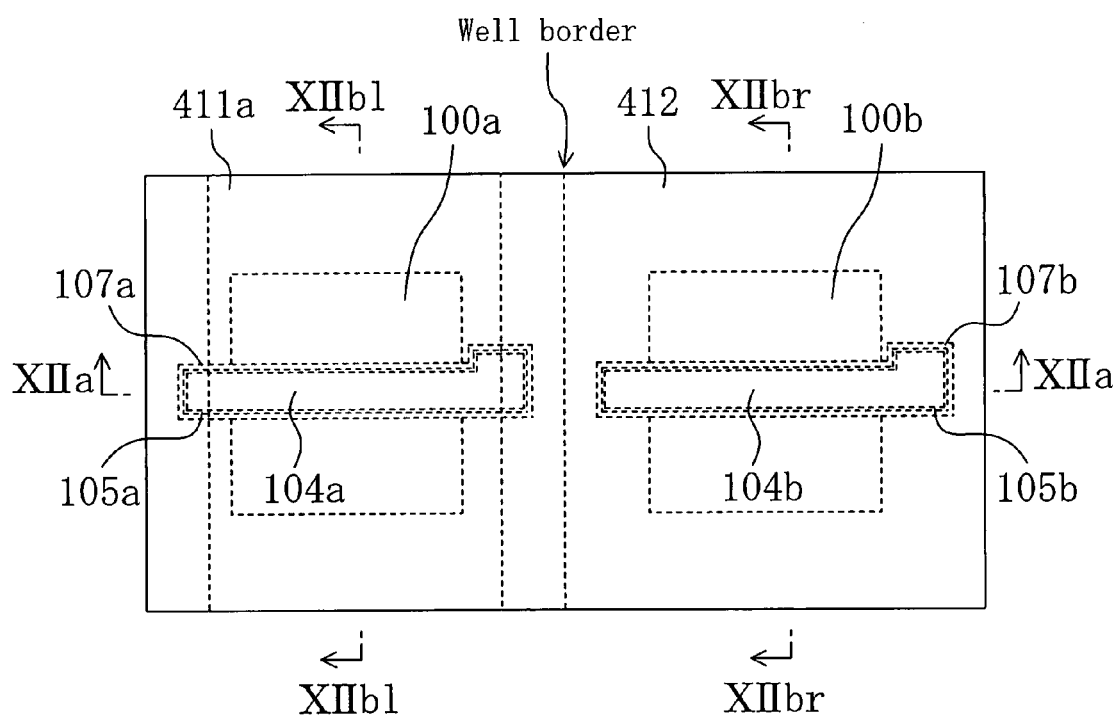
FIG. 11 is a plan view showing a structure of a semiconductor device according to embodiment 2 of the present invention.
Figure 12A:
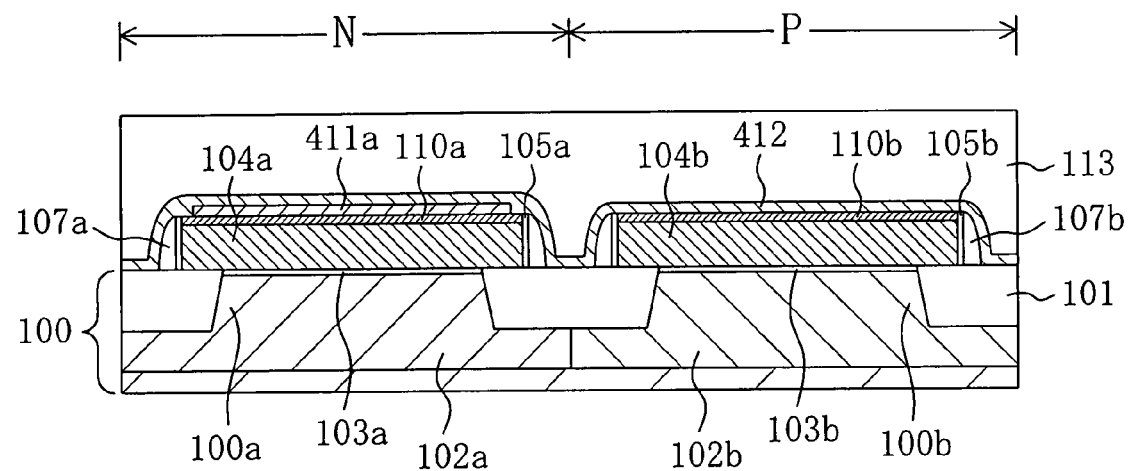
FIG. 12A and FIG. 12B are cross-sectional views showing the structure of the semiconductor device according to embodiment 2 of the present invention.
Figure 12B:
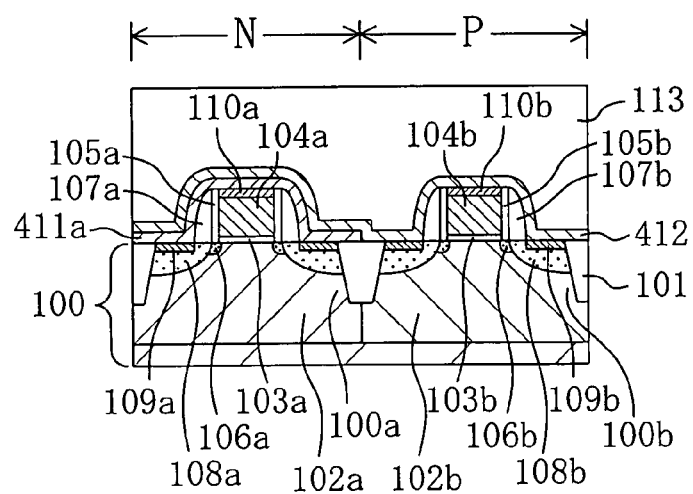

Hereinafter, a semiconductor device according to embodiment 2 of the present invention is described with reference to FIG. 11, FIG. 12A and FIG. 12B. FIG. 11 is a plan view showing the structure of the semiconductor device according to embodiment 2 of the present invention. It should be noted that the left half of the drawings shows an N-type MIS formation region, and the right half of the drawings shows a P-type MIS formation region. FIG. 12A and FIG. 12B are cross-sectional views showing the structure of the semiconductor device according to embodiment 2 of the present invention. Specifically, FIG. 12A is a cross-sectional view taken along line XIIa-XIIa of FIG. 11, i.e., a cross-sectional view taken along the gate width. The left part of FIG. 12B shows a cross section taken along line XIIbl-XIIbl of FIG. 11, i.e., a cross-sectional view taken along the gate length. The right part of FIG. 12B shows a cross section taken along line XIIbr-XIIbr of FIG. 11, i.e., another cross-sectional view taken along the gate length. It should be noted that, in the drawings, indication "N" on the left part refers to the N-type MIS formation region, while indication "P" on the right part refers to the P-type MIS formation region. In FIG. 11, FIG. 12A and FIG. 12B, the same components as those of the above-described semiconductor device according to embodiment 1 are denoted by the same reference numerals. Therefore, in this embodiment, the same descriptions as those of embodiment 1 are not herein repeated.

Embodiment is 2 herein described specifically with an example where an N-type MIS transistor and a P-type MIS transistor are provided on a semiconductor substrate whose principal surface is (100) surface such that the gate length direction of the gate electrodes of the N-type and P-type transistors is set to <100> direction.

As shown in FIG. 11, the N-type MIS formation region includes an active region 100a which is part of the semiconductor substrate surrounded by an isolation region, while the P-type MIS formation region includes an active region 100b which is another part of the semiconductor substrate surrounded by the isolation region. A gate electrode 104a is provided on the active region 100a of the N-type MIS formation region with a gate insulating film interposed therebetween. A gate electrode 104b is provided on the active region 100b of the P-type MIS formation region with a gate insulating film interposed therebetween. The side faces of the gate electrodes 104a and 104b are covered with offset side walls 105a and 105b which in turn are covered with side walls 107a and 107b.

According to this embodiment, as shown in FIG. 11, a tensile stressor insulating film 411a is provided on the semiconductor substrate so as to cover the upper face and side faces facing in the gate length direction of the gate electrode 104a of the N-type MIS formation region. Also, a compressive stressor insulating film 412 is provided on the semiconductor substrate so as to cover the gate electrodes 104a and 104b. Herein, for example, the edges of the tensile stressor insulating film 411a at the width ends of the gate electrode 104a exist on the part of the gate electrode 104a lying over an isolation region 101 as shown in FIG. 11.

Referring to FIGS. 12A and 12B, the isolation region 101 which is formed by a silicon oxide film buried in a trench is selectively provided in the upper part of the semiconductor substrate 100. Thus, the N-type MIS formation region includes the active region 100a which is part of the semiconductor substrate 100 surrounded by the isolation region 101, while the P-type MIS formation region includes the active region 100b which is another part of the semiconductor substrate 100 surrounded by the isolation region 101. The N-type MIS formation region includes a P-type well region 102a in the semiconductor substrate 100, while the P-type MIS formation region includes an N-type well region 102b in the semiconductor substrate 100.

The gate electrode 104a is provided on the active region 100a of the N-type MIS formation region with a gate insulating film 103a interposed therebetween. The gate electrode 104b is provided on the active region 100b of the P-type MIS formation region with a gate insulating film 103b interposed therebetween. The side faces of the gate electrodes 104a and 104b are covered with offset side walls 105a and 105b which in turn are covered with side walls 107a and 107b.

Referring to FIG. 12B, part of the active region 100a of the N-type MIS formation region diagonally under the gate electrode 104a is an N-type extension region 106a, and another part of the active region 100a diagonally under the side wall 107a is an N-type source-drain region 108a. The N-type source-drain region 108a has a junction deeper than that of the N-type extension region 106a. Part of the active region 100b of the P-type MIS formation region diagonally under the gate electrode 104b is a P-type extension region 106b, and another part of the active region 100b diagonally under the side wall 107b is a P-type source-drain region 108b. The P-type source-drain region 108b has a junction deeper than that of the P-type extension region 106b.

Silicide films 109a and 109b are provided on the source-drain regions 108a and 108b, respectively. Silicide films 110a and 110b are provided on the gate electrodes 104a and 104b, respectively.

According to this embodiment, as shown in FIG. 12B, the tensile stressor insulating film 411a is provided on the semiconductor substrate 100 so as to cover the upper face and side faces facing in the gate length direction of the gate electrode 104a of the N-type MIS formation region. It should be noted, however, that the tensile stressor insulating film 411a does not cover the faces of the gate electrode 104a facing in the gate width direction (see FIG. 12A). Also, the compressive stressor insulating film 412 is provided on the semiconductor substrate 100 so as to cover the gate electrodes 104a and 104b. An interlayer insulating film 113 is provided on the compressive stressor insulating film 412.

As described above, according to this embodiment, in the N-type MIS formation region, the upper face and side faces facing in the gate length direction of the gate electrode 104a are covered with the tensile stressor insulating film 411a which in turn is covered with the compressive stressor insulating film 412. The side faces of the gate electrode 104a facing in the gate width direction are covered with the compressive stressor insulating film 412.

In the P-type MIS formation region, all of the upper face, side faces facing in the gate length direction, and side faces facing in the gate width direction of the gate electrode 104b are covered with the compressive stressor insulating film 412.

Figure 13A:
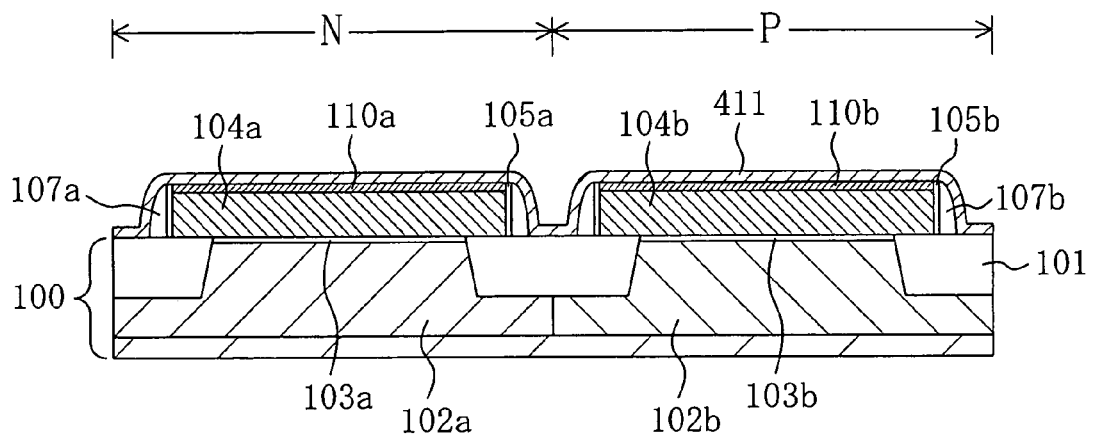
FIG. 13A through FIG. 13C are cross-sectional views illustrating the steps of a semiconductor device fabrication method according to embodiment 2 of the present invention, which show the principal part of the semiconductor device along the gate width.
Figure 13B:
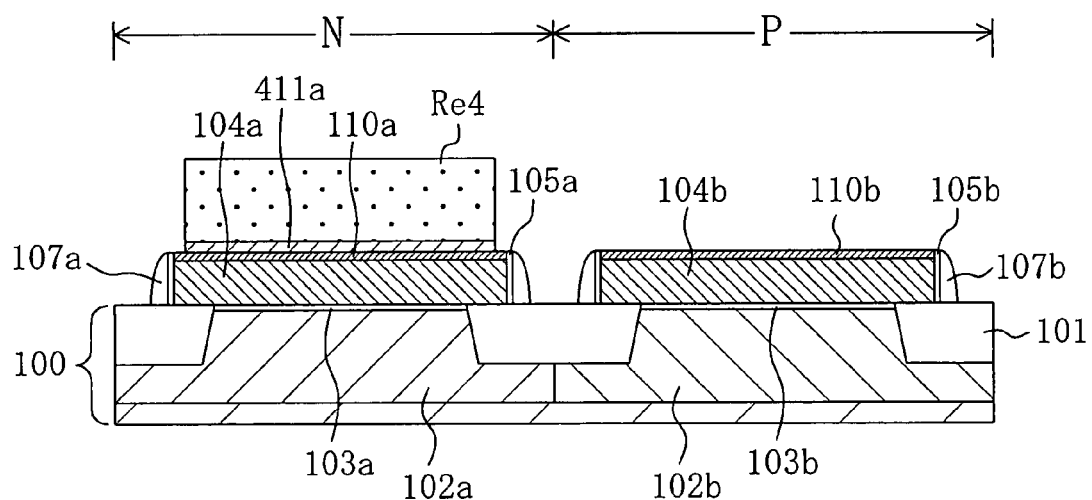
Figure 13C:
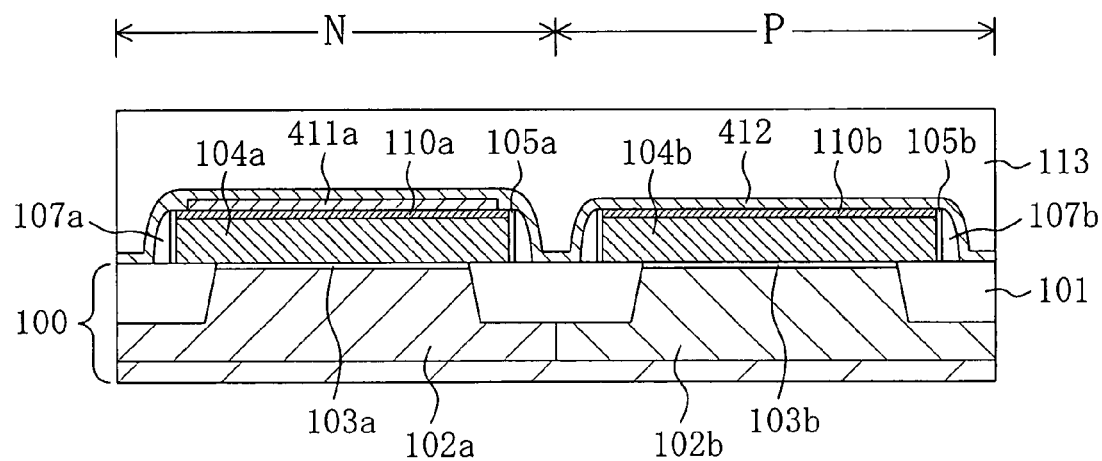
Figure 14A:
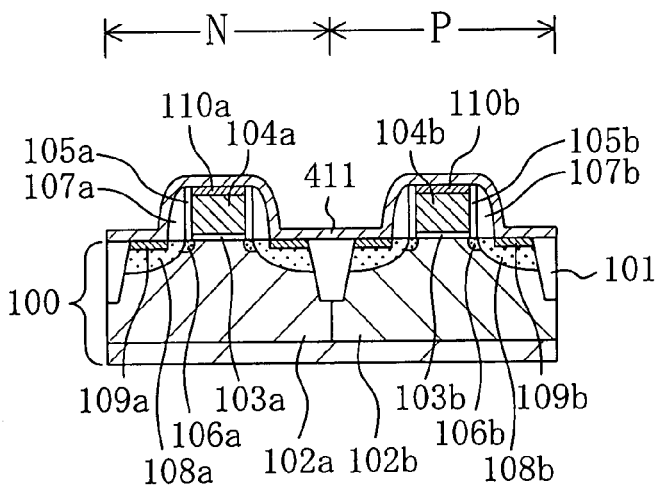
FIG. 14A through FIG. 14C are cross-sectional views illustrating the steps of a semiconductor device fabrication method according to embodiment 2 of the present invention, which show the principal part of the semiconductor device along the gate length.
Figure 14B:
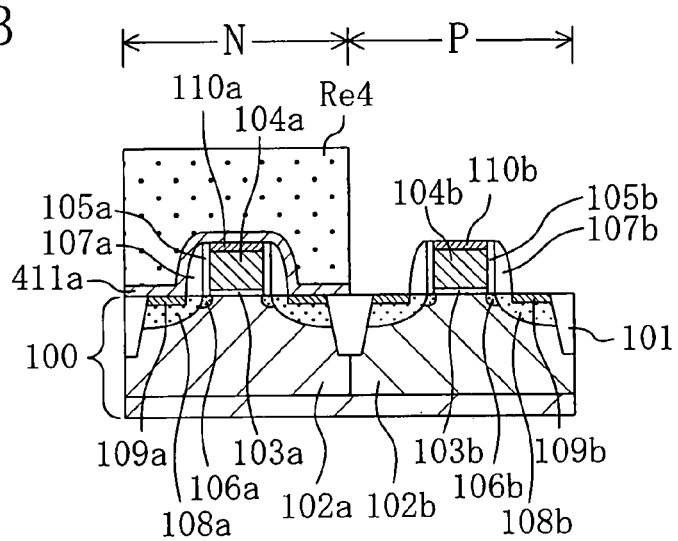
Figure 14C:
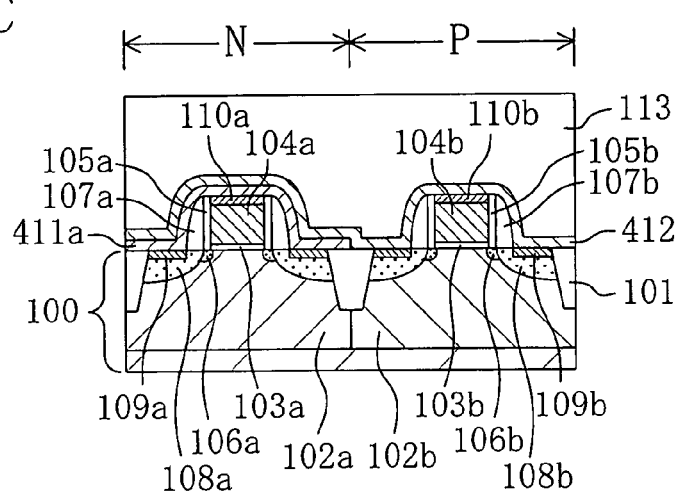

Hereinafter, a semiconductor device fabrication method according to embodiment 2 of the present invention is described with reference to FIG. 3A through FIG. 3C and FIG. 6A through FIG. 6C, and FIG. 4A through FIG. 4C and FIG. 7A through FIG. 7C, which have been mentioned above, and FIG. 13A through FIG. 13C and FIG. 14A through FIG. 14C. FIG. 13A through FIG. 13C are cross-sectional views illustrating the steps of the semiconductor device fabrication method according to embodiment 2 of the present invention, which show the principal part of a semiconductor device along the gate width. It should be noted that indication "N" on the left part refers to the N-type MIS formation region, while indication "P" on the right part refers to the P-type MIS formation region. FIG. 14A through FIG. 14C are cross-sectional views illustrating the steps of the semiconductor device fabrication method according to embodiment 2 of the present invention, which show the principal part of the semiconductor device along the gate length. For simplicity of illustration in the drawings, the N-type MIS formation region is shown on the left side, and the P-type MIS formation region is shown on the right side. Herein, in FIG. 13A through FIG. 13C and FIG. 14A through FIG. 14C, the same components as those of the above-described semiconductor device of embodiment 1 are denoted by the same reference numerals. Therefore, the same descriptions as those of embodiment 1 are not herein repeated. The steps of FIG. 13A through FIG. 13C correspond to the steps of FIG. 14A through FIG. 14C, respectively.

First, the steps of FIG. 3A through FIG. 3C and FIG. 6A through FIG. 6C and FIG. 4A through FIG. 4C and FIG. 7A through FIG. 7C are sequentially carried out as previously described.

Then, referring to FIG. 13A and FIG. 14A, a tensile stressor insulating film 411 is formed of silicon nitride to a thickness of 30 nm by, for example, LPCVD entirely over the semiconductor substrate 100 so as to cover the gate electrodes 104a and 104b.

Then, referring to FIG. 13B and FIG. 14B, a resist film Re4 is formed over the tensile stressor insulating film 411 such that the N-type MIS formation region is partially covered with the resist film Re4 while the resist film Re4 has an opening entirely over the P-type MIS formation region. Then, the resist film Re4 is used as a mask to etch away the part of the tensile stressor insulating film 411 exposed through an opening of the resist film Re4, and then, the resist film Re4 is removed. In this way, the part of the tensile stressor insulating film 411 which exists in the P-type MIS formation region and the part of the tensile stressor insulating film 411 which exists on the side faces facing in the gate width direction of the gate electrode 104a of the N-type MIS formation region are removed. As a result, the tensile stressor insulating film 411a remains on the upper face and side faces facing in the gate length direction of the gate electrode 104a of the N-type MIS formation region.

Then, referring to FIG. 13C and FIG. 14C, a compressive stressor insulating film 412 is formed of silicon nitride by, for example, PECVD to a thickness of 30 nm entirely over the semiconductor substrate 100 so as to cover the gate electrodes 104a and 104b. Then, an interlayer insulating film 113 is formed by, for example, CVD over the compressive stressor insulating film 412, and the surface of the interlayer insulating film 113 is planarized by CMP.

Then, in the same manner as the commonly-employed fabrication method for semiconductor devices having MIS transistors, a contact hole (not shown) is formed in the tensile stressor insulating film 411a, the compressive stressor insulating film 412, and the interlayer insulating film 113 so as to reach the silicide films 109a and 110a of the N-type MIS formation region, while a contact hole (not shown) is formed in the compressive stressor insulating film 412 and the interlayer insulating film 113 so as to reach the silicide films 109b and 110b of the P-type MIS formation region. Then, a barrier metal film (not shown) is formed on the bottom and side wall of each contact hole, and a metal film is then buried in each contact hole. In this way, a contact plug (not shown) is obtained wherein the metal film fills the contact hole with the barrier metal film interposed therebetween. Thereafter, a metal wire (not shown) is formed on the interlayer insulating film 113 so as to be electrically connected with the contact plug.

As described above, the semiconductor device of this embodiment is thus fabricated.

Herein, in this embodiment, the gate length direction of the gate electrode is set to <100> direction, and therefore, in an N-type MIS transistor, the orientation of the stress (tensile or compressive) with which the drivability of the N-type MIS transistor is improved differs between the gate length direction and the gate width direction. Specifically, as shown in FIG. 18B, tensile stress is necessary in the gate length direction, while compressive stress is necessary in the gate width direction.

Under such circumstances, according to this embodiment, as shown in FIG. 11 and FIGS. 12A and 12B, the tensile stressor insulating film 411a is provided over the upper face and side faces facing in the gate length direction of the gate electrode 104a of the N-type MIS formation region, while the compressive stressor insulating film 412 is provided over the side faces facing in the gate width direction of the gate electrode 104a.

According to this embodiment, the side faces facing in the gate width direction of the gate electrode 104a of the N-type MIS formation region are not covered with the tensile stressor insulating film 411a. Therefore, there is no probability that tensile stress acts on the channel of the N-type MIS transistor in the gate width direction. Thus, deterioration in drivability of the N-type MIS transistor is prevented. In addition, since the tensile stressor insulating film 411a is provided over the upper face and side faces facing in the gate length direction of the gate electrode 104a, tensile stress acts on the channel of the N-type MIS transistor in the gate length direction. Thus, the drivability of the N-type MIS transistor is improved.

According to this embodiment, the tensile stressor insulating film 411a is provided over the upper face and side faces facing in the gate length direction of the gate electrode 104a of the N-type MIS formation region, and in addition, the compressive stressor insulating film 412 is provided over the side faces facing in the gate width direction of the gate electrode 104a. With this structure, tensile stress acts on the channel of the N-type MIS transistor in the gate length direction while compressive stress acts on the channel in the gate width direction. Thus, the drivability of the N-type MIS transistor is further improved.

Since in this embodiment the gate length direction of the gate electrode is set to <100> direction, the P-type MIS transistor requires compressive stress in the gate length direction for improving the drivability of the P-type MIS transistor as illustrated in FIG. 18B. In this embodiment, compressive stress acts on the channel of the P-type MIS transistor in the gate length direction because the compressive stressor insulating film 412 is provided over the upper face, side faces facing in the gate length direction, and side faces facing in the gate width direction of the gate electrode 104b of the P-type MIS formation region. Thus, the drivability of the P-type MIS transistor is improved.

In the example specifically described for this embodiment, the compressive stressor insulating film 412 is used, but the present invention is not limited thereto. For example, a stress-free base insulating film may be used in place of the compressive stressor insulating film 412.

With such a structure, tensile stress acts only in the gate length direction on the channel of the N-type MIS transistor without occurrence of tensile stress in the gate width direction, although compressive stress does not occur in the gate width direction. Therefore, deterioration in drivability of the N-type MIS transistor is prevented while the drivability of the N-type MIS transistor is improved.

-Third Variation-

Figure 15A:
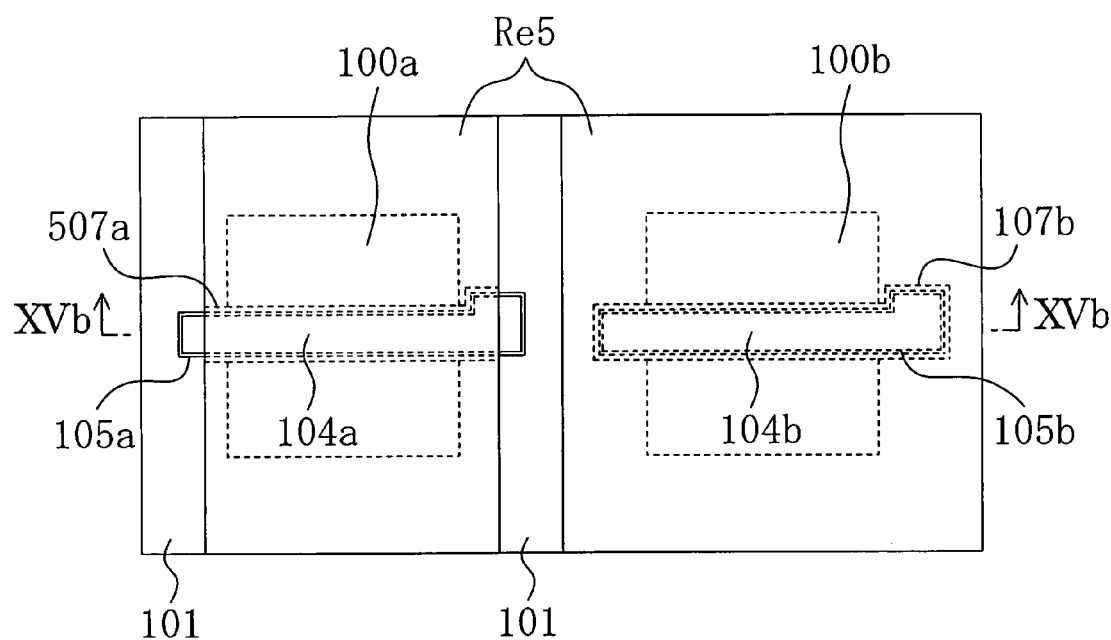
FIG. 15A is a plan view for illustrating a semiconductor device fabrication method according to the third variation of the present invention, which shows the principal part of the semiconductor device.
Figure 15B:
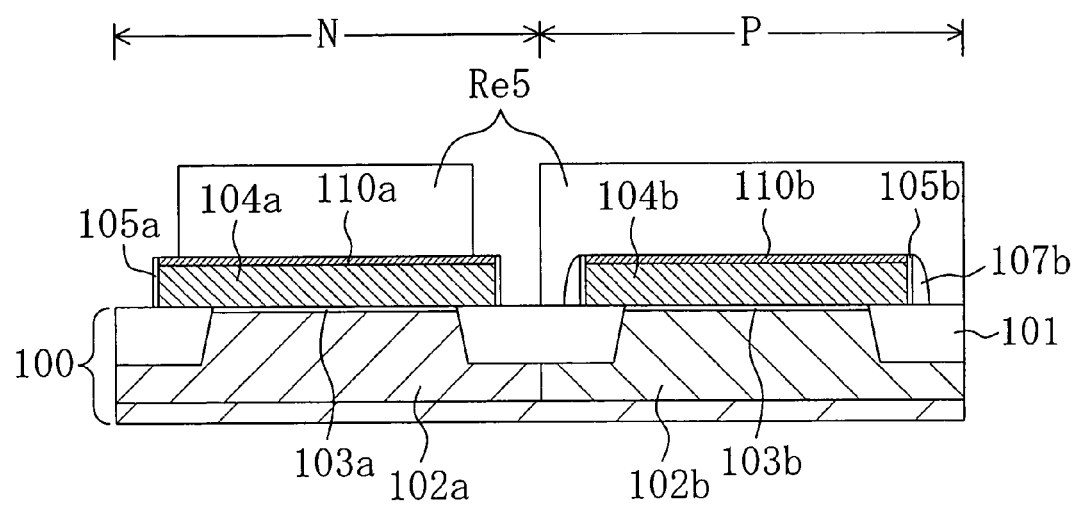
FIG. 15B is a cross-sectional view for illustrating the semiconductor device fabrication method according to the third variation of the present invention, which shows the principal part of the semiconductor device along the gate width.

Hereinafter, a semiconductor device fabrication method according to the third variation of the present invention is described with reference to FIG. 15A and FIG. 15B. FIG. 15A is a plan view for illustrating a semiconductor device fabrication method according to the third variation of the present invention, which shows the principal part of the semiconductor device. FIG. 15B is a cross-sectional view for illustrating the semiconductor device fabrication method according to the third variation of the present invention, which shows the principal part of the semiconductor device. Specifically, FIG. 15B is a cross-sectional view taken along line XVb-XVb of FIG. 15A, i.e., along the gate width. It should be noted that the left half of the drawings shows an N-type MIS formation region, and the right half of the drawings shows a P-type MIS formation region. In FIG. 15A and FIG. 15B, components equivalent to those of the semiconductor device of embodiment 2 are denoted by the same reference numerals. Therefore, the same descriptions as those of embodiment 2 are not repeated herein for the third variation.

After sequentially performing the processes of steps illustrated in FIG. 3A through FIG. 3C and FIG. 6A through FIG. 6C, FIG. 4A through FIG. 4C and FIG. 7A through FIG. 7C, and FIGS. 13A and 13B and FIGS. 14A and 14B, a resist film Re5 is formed on the semiconductor substrate such that the resist film Re5 has an opening in part of the N-type MIS formation region and entirely covers the P-type MIS formation region as shown in FIG. 15A and FIG. 15B. Thereafter, the parts of the side wall which are exposed through the openings of the resist film Re5 are removed, and then, the resist film Re5 is removed. In such a way, the side wall covering the side faces facing in the gate width direction of the gate electrode 104a of the N-type MIS formation region is removed such that the offset side wall 105a is exposed, while the side wall 207a remains over the side faces facing in the gate length direction of the gate electrode 104a with the offset side wall 105a interposed therebetween.

Then, as in the step of FIG. 13C and FIG. 14C, a compressive stressor insulating film is formed by PECVD entirely over the semiconductor substrate so as to cover the gate electrodes 104a and 104b. In this step, the compressive stressor insulating film is formed over the side faces facing in the gate width direction of the gate electrode 104a of the N-type MIS formation region with the offset side wall 105a interposed therebetween. Then, as in embodiment 2, the steps equivalent to those of the commonly-employed fabrication method for semiconductor devices having MIS transistors are sequentially carried out, such that the semiconductor device according to this variation is fabricated.

Herein, the differences between embodiment 2 and the third variation of the present invention are described below.

In this variation, no side wall is provided over the side faces facing in the gate width direction of the gate electrode 104a of the N-type MIS formation region such that the compressive stressor insulating film is provided over the side faces with the offset side wall 105a interposed therebetween, whereas in embodiment 2 the compressive stressor insulating film 412 is provided over the side faces facing in the gate width direction of the gate electrode 104a of the N-type MIS formation region with the offset side wall 105a and side wall 107a interposed therebetween (see FIG. 12A).

According to this variation, the compressive stressor insulating film is provided over the side faces facing in the gate width direction of the gate electrode 104a of the N-type MIS formation region with the offset side wall 105a interposed therebetween (side wall has been previously removed). With this structure, compressive stress efficiently acts on the channel of the N-type MIS transistor in the gate width direction. Thus, the drivability of the N-type MIS transistor is further improved.

Namely, according to this variation, the side wall 107a interposed between the side faces facing in the gate width direction of the gate electrode 104a and the compressive stressor insulating film 412 prevents relaxation of the compressive stress acting on the channel of the N-type MIS transistor in the gate width direction as in embodiment 2.

Thus, in this variation, the drivability of the N-type MIS transistor is further improved as compared with embodiment 2.

In this variation, as for the offset side wall and side wall formed on the side faces facing in the gate width direction of the gate electrode 104a of the N-type MIS formation region, only the side wall is removed, but the exposed offset side wall may also be removed such that the side faces facing in the gate width direction of the gate electrode 104a are exposed. In this case, when forming a compressive stressor insulating film, the compressive stressor insulating film can be formed directly on the side faces facing in the gate width direction of the gate electrode 104a. Therefore, compressive stress acts more efficiently on the channel of the N-type MIS transistor in the gate width direction as compared with the third variation.

-Fourth Variation-

Figure 16A:
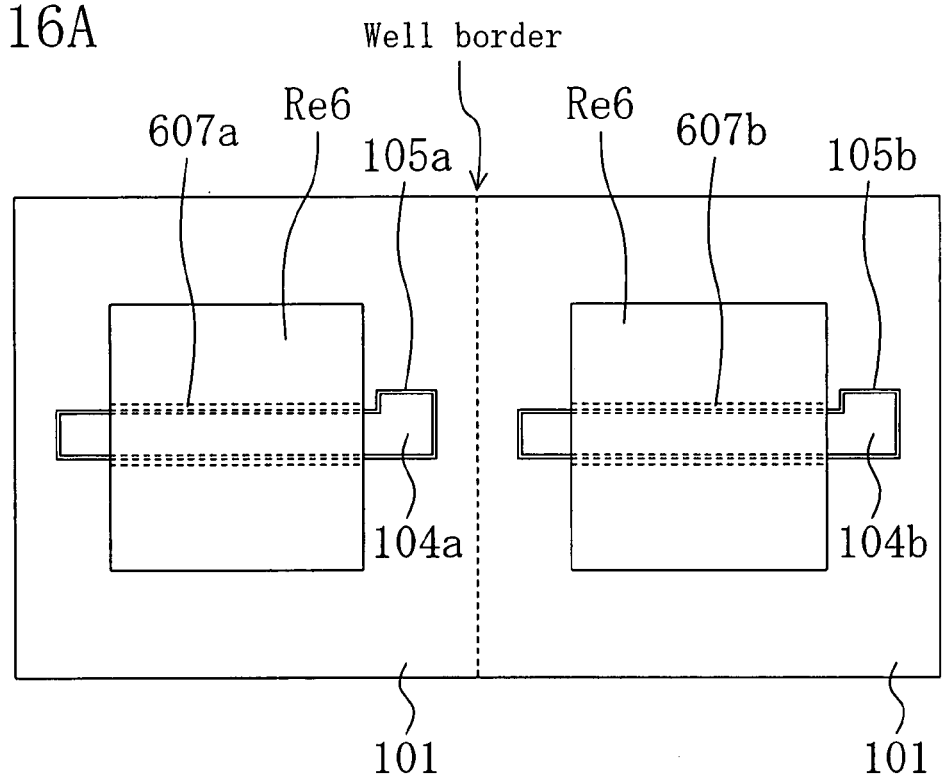
FIG. 16A and FIG. 16B are plan views for illustrating a semiconductor device fabrication method according to the fourth variation of the present invention, which show the principal part of the semiconductor device.
Figure 16B:
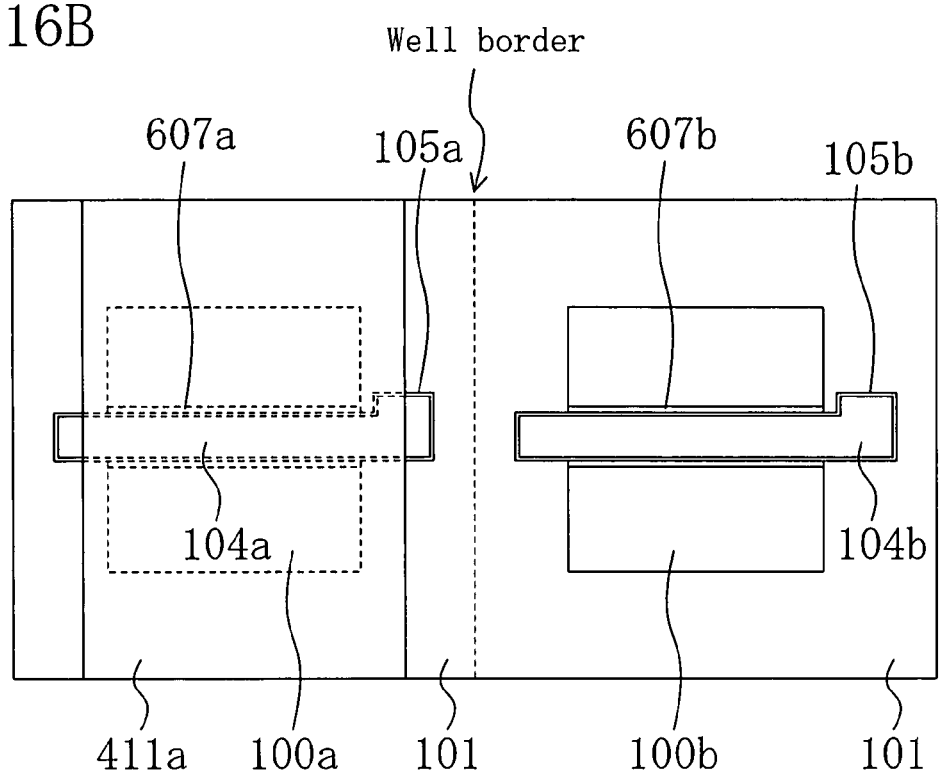
Figure 17:
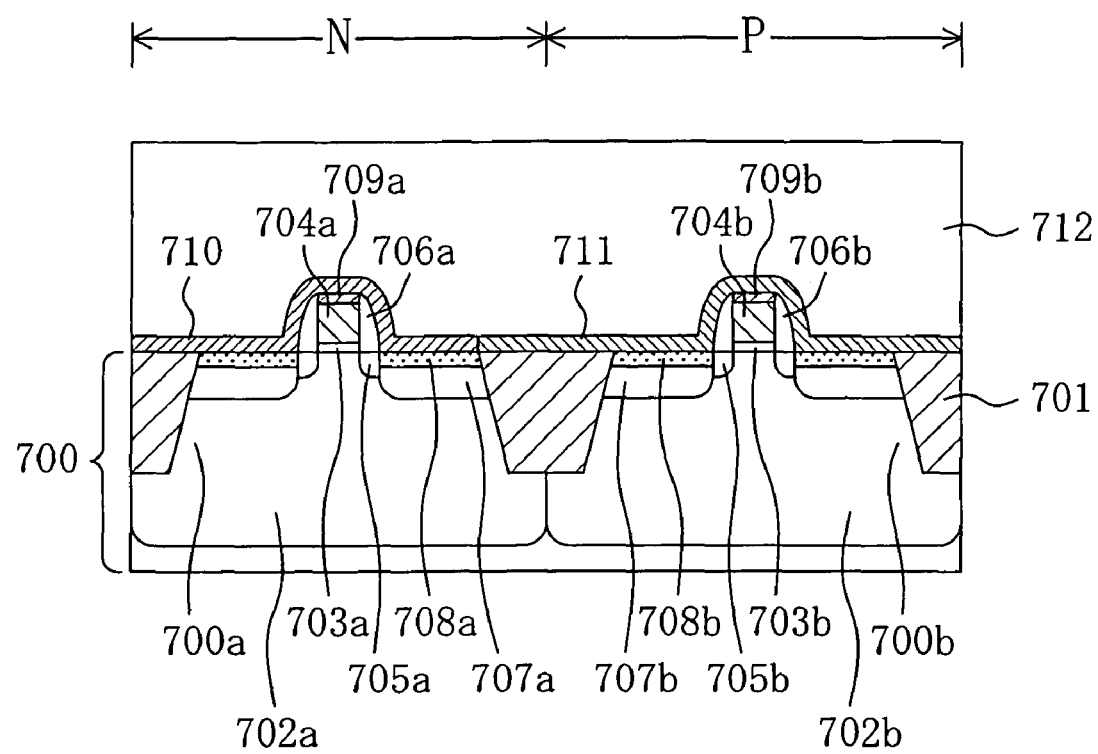
FIG. 17 is a cross-sectional view of a structure of a conventional semiconductor device.

Hereinafter, a semiconductor device fabrication method according to the fourth variation of the present invention is described with reference to FIG. 16A and FIG. 16B. FIG. 16A and FIG. 16B are plan views for illustrating the semiconductor device fabrication method according to the fourth variation of the present invention, which show the principal part of the semiconductor device. It should be noted that the left half of the drawings shows an N-type MIS formation region, and the right half of the drawings shows a P-type MIS formation region. In FIG. 16A and FIG. 16B, components equivalent to those of the semiconductor device of embodiment 2 are denoted by the same reference numerals. Therefore, the same descriptions as those of embodiment 2 are not repeated herein for the fourth variation.

After sequentially performing the processes of steps illustrated in FIG. 3A through FIG. 3C and FIG. 6A through FIG. 6C and FIG. 4A through FIG. 4C and FIG. 7A through FIG. 7C, a resist film Re6 is formed on the semiconductor substrate such that the resist film Re6 covers the active region of the N-type MIS formation region and the active region of the P-type MIS formation region and has openings over the isolation region 101 of the N-type MIS formation region and the isolation region 101 of the P-type MIS formation region as shown in FIG. 16A. Herein, for example, the resist film used for the formation of the trench in the semiconductor substrate 100 at the step of FIG. 3A and FIG. 6A is employed as the resist film Re6. Thereafter, the part of the side wall exposed through the opening of the resist film Re6 is removed, and then, the resist film Re6 is removed. In this variation, the side wall removal step occurs between formation of the silicide film and formation of the tensile stressor insulating film but may occur between formation of the side wall and formation of the source-drain regions or between formation of the source-drain regions and formation of the silicide film.

In this way, the part of the side wall formed on the isolation region 101 is removed, such that the side walls 607a and 607b remain on the side faces of the parts of the gate electrodes 104a and 104b which exist over the active regions with the offset side walls 105a and 105b interposed therebetween.

Then, as in the step of FIG. 13A and FIG. 14A, a tensile stressor insulating film is formed of silicon nitride to a thickness of 30 nm by LPCVD entirely over the semiconductor substrate so as to cover the gate electrodes 104a and 104b. In this step, the tensile stressor insulating film is formed over the side faces of the parts of the gate electrodes 104a and 104b which exist over the isolation region 101 with the offset side walls 105a and 105b interposed therebetween.

Then, as in the step of FIG. 13B and FIG. 14B, a resist film is formed over the semiconductor substrate such that the N-type MIS formation region is partially covered with the resist film while the resist film has an opening entirely over the P-type MIS formation region. Thereafter, the parts of the tensile stressor insulating film exposed through openings of the resist film are removed, and then, the resist film is removed. In this way, as illustrated in FIG. 16B, the offset side wall 105a provided over the side faces facing in the gate width direction of the gate electrode 104a of the N-type MIS formation region is exposed, while the tensile stressor insulating film 411a remains over the upper face and side faces facing in the gate length direction of the gate electrode 104a.

Then, as in the step of FIG. 13C and FIG. 14C, a compressive stressor insulating film is formed by, for example, PECVD entirely over the semiconductor substrate so as to cover the gate electrodes 104a and 104b. In this step, the compressive stressor insulating film is formed over the side faces of the gate electrodes 104a and 104b facing in the gate width direction with the offset side wall 105a interposed therebetween. Then, as in embodiment 2, the steps equivalent to those of the commonly-employed fabrication method for semiconductor devices having MIS transistors are sequentially carried out, such that the semiconductor device according to this variation is fabricated.

Herein, the differences between the third variation and the fourth variation of the present invention are described below.

In the fourth variation, a side wall 607b does not remain over the isolation region 101 of the N-type MIS formation region but is provided only on the active region 100a whereas in the third variation the side wall 507a remains on the isolation region 101 of the N-type MIS formation region. Herein, in the fourth variation, the side faces of the parts of the gate electrodes 104a and 104b which exist over the active regions 100a and 100b are covered with the offset side walls 105a and 105b which in turn are covered with the side walls 607a and 607b. Therefore, this structure does not cause any adverse effect on the characteristics of the N-type and P-type MIS transistors.

According to this variation, the compressive stressor insulating film is provided over the side faces facing in the gate width direction of the gate electrode 104a of the N-type MIS formation region with the offset side wall 105a interposed therebetween. In addition, the side wall 607a does not remain on the side faces of the gate electrode 104a which exist over the isolation region 101. With this structure, compressive stress acts more efficiently on the channel of the N-type MIS transistor in the gate width direction.

Thus, in the fourth variation, the drivability of the N-type MIS transistor is further improved as compared with the third variation.

It should be noted that, in the specific example described above for the fourth variation, the resist film used for the formation of the trench in the semiconductor substrate 100 is employed as the resist film Re6 with the view of entirely removing the part of the side wall 107a which exists over the isolation region 101. However, the present invention is not limited to this example.

It should be noted that, in the fourth variation, as for the offset side wall and side wall formed on the isolation region 101, only the side wall is removed. However, the offset side wall may also be removed. In this case, compressive stress acts more efficiently on the channel of the N-type MIS transistor in the gate width direction as compared with the fourth variation.

Other Embodiments

The present invention is not limited to the specific example described for embodiment 1 wherein the compressive stressor insulating film 111b and the tensile stressor insulating film 112 are provided over the upper face and side faces facing in the gate length direction of the gate electrode 104b of the P-type MIS formation region.

For example, as in the step of FIG. 5C and FIG. 8C, the tensile stressor insulating film 112 is formed entirely over the semiconductor substrate 100 so as to cover the gate electrodes 104a and 104b, and then, a resist film having a desired shape is photolithographically formed on the semiconductor substrate 100 before the step of forming the interlayer insulating film 113. Thereafter, the resist film is used as a mask to selectively etch away the part of the tensile stressor insulating film 112 which exists over the upper face and side faces facing in the gate length direction of the gate electrode 104b, and then, the resist film is removed. As a result, the tensile stressor insulating film remains on the side faces of the gate electrode 104b facing in the gate width direction. Thereafter, the same step as that of FIG. 5C and FIG. 8C is performed, and then, the steps equivalent to those of the commonly-employed fabrication method for semiconductor devices having MIS transistors are sequentially carried out.

As a result, only the compressive stressor insulating film 111b is provided over the upper face and side faces facing in the gate length direction of the gate electrode 104b of the P-type MIS formation region. Therefore, compressive stress acts more effectively on the channel of the P-type MIS transistor in the gate length direction. Thus, the drivability of the P-type MIS transistor is further improved.

In the specific example described in embodiment 2, the tensile stressor insulating film 411a and the compressive stressor insulating film 412 are provided over the upper face and side faces facing in the gate length direction of the gate electrode 104a of the N-type MIS formation region, but the present invention is not limited to this example.

For example, as in the step of FIG. 13C and FIG. 14C, the compressive stressor insulating film 412 is formed entirely over the semiconductor substrate 100 so as to cover the gate electrodes 104a and 104b, and then, a resist film having a desired shape is photolithographically formed on the semiconductor substrate 100 before formation of the interlayer insulating film 113. Thereafter, the resist film is used as a mask to selectively etch away the parts of the compressive stressor insulating film 412 which exist over the upper face and side faces facing in the gate length direction of the gate electrode 104a, and then, the resist film is removed. As a result, the compressive stressor insulating film remains on the side faces of the gate electrode 104a facing in the gate width direction. Thereafter, the same step as that of FIG. 13C and FIG. 14C is performed, and then, the steps equivalent to those of the commonly-employed fabrication method for semiconductor devices having MIS transistors are sequentially carried out.

As a result, only the tensile stressor insulating film 411a is provided over the upper face and side faces facing in the gate length direction of the gate electrode 104a of the N-type MIS formation region. Therefore, tensile stress acts more effectively on the channel of the N-type MIS transistor in the gate length direction. Thus, the drivability of the N-type MIS transistor is further improved.

The specific examples described in embodiments 1 and 2 are directed to a semiconductor device having both N-type MIS transistors and P-type MIS transistors, but the present invention is not limited thereto. The present invention is applicable to, for example, a semiconductor device having only N-type MIS transistors and a semiconductor device having only P-type MIS transistors.

In the specific examples described in embodiments 1 and 2, the transistor wherein the orientation of the stress (tensile or compressive) with which the drivability of the N-type MIS transistor is improved differs between the gate length direction and the gate width direction is a P-type MIS transistor in which the gate length direction of the gate electrode is set to <110> direction or an N-type MIS transistor in which the gate length direction of the gate electrode is set to <100> direction. However, the present invention is not limited to these examples.

In the specific examples described in embodiments 1 and 2, the first stressor insulating film (the compressive stressor insulating film 111b, the tensile stressor insulating film 411a) and the first base insulating film (the tensile stressor insulating film 112, the compressive stressor insulating film 412) overlap with each other in the first MIS transistor, in particular, over the active region of the first MIS transistor. However, the present invention is not limited to this example. For example, the present invention is applicable to an example where the first base insulating film is removed from the space overlying the active region of the first MIS transistor.

It should be noted that, as described above, the present invention is useful for a semiconductor device having a stressor insulating film on a gate electrode and a fabrication method thereof.

What is claimed is:

1. A semiconductor device comprising a first MIS transistor on a first active region of a semiconductor substrate, the first MIS transistor including:
   a first gate insulating film provided on the first active region;
   a first gate electrode provided on the first gate insulating film;
   a first stressor insulating film provided on an upper face and side faces facing in a gate length direction of the first gate electrode such that first stress acts on a channel of the first MIS transistor in the gate length direction;
   a first base insulating film provided on side faces of the first gate electrode facing in a gate width direction; and
   a first side wall provided between the side faces of the first gate electrode facing in the gate length direction and the first stressor insulating film,
   wherein the side faces of the first gate electrode facing in the gate width direction are not covered with the first stressor insulating film,
   the first active region is surrounded by an isolation region formed in the semiconductor substrate,
   an edge of the first stressor insulating film in the gate width direction is located on a part of the first gate electrode existing on the isolation region, and
   the first side wall does not exist between the side faces of the first gate electrode facing in the gate width direction and the first base insulating film.

2. The semiconductor device of claim 1, wherein:
   the first base insulating film is a second stressor insulating film which causes second stress on the channel of the first MIS transistor in the gate width direction;
   the first stress is any one of compressive stress and tensile stress; and
   the second stress is the other one of compressive stress and tensile stress.

3. The semiconductor device of claim 2, wherein:
   the first MIS transistor is a P-type MIS transistor;
   the first stress is compressive stress; and
   the second stress is tensile stress.

4. The semiconductor device of claim 3, wherein:
   a principal surface of the semiconductor substrate is (100) surface; and
   the gate length direction of the first gate electrode is <110> direction.

5. The semiconductor device of claim 2, wherein:
   the first MIS transistor is an N-type MIS transistor;
   the first stress is tensile stress; and
   the second stress is compressive stress.

6. The semiconductor device of claim 5, wherein:
   a principal surface of the semiconductor substrate is (100) surface; and
   the gate length direction of the first gate electrode is <100> direction.

7. The semiconductor device of claim 2, further comprising a second MIS transistor provided on a second active region of the semiconductor substrate, the second MIS transistor including a second gate insulating film provided on the second active region, a second gate electrode provided on the second gate insulating film, and a second base insulating film provided on the second gate electrode, wherein the second base insulating film is a third stressor insulating film which causes third stress on a channel of the second MIS transistor, the third stressor insulating film and the second stressor insulating film are made of a same insulating film, the second active region is surrounded by the isolation region formed in the semiconductor substrate, and the first active region and the second active region are separated from each other by the isolation region.

8. The semiconductor device of claim 7, wherein:
the first MIS transistor is a P-type MIS transistor;
the second MIS transistor is an N-type MIS transistor;
the first stress is compressive stress;
the second stress is tensile stress; and
the third stress is tensile stress.

9. The semiconductor device of claim 8, wherein:
a principal surface of the semiconductor substrate is (100) surface; and
the gate length direction of the first and second gate electrodes is <110> direction.

10. The semiconductor device of claim 7, wherein:
the first MIS transistor is an N-type MIS transistor;
the second MIS transistor is a P-type MIS transistor;
the first stress is tensile stress;
the second stress is compressive stress; and
the third stress is compressive stress.

11. The semiconductor device of claim 10 wherein:
a principal surface of the semiconductor substrate is (100) surface; and
the gate length direction of the first and second gate electrodes is <100> direction.

12. The semiconductor device of claim 7, wherein
the second MIS transistor further includes a second side wall provided on side faces of part of the second gate electrode which exists over the second active region; and the second side wall does not exist between side faces of part of the second gate electrode which exists over the isolation region and the third stressor insulating film.

13. The semiconductor device of claim 1, wherein:
the first side wall is provided on side faces of part of the first gate electrode which exists over the first active region; and the first side wall does not exist between side faces facing in the gate length direction of part of the first gate electrode which exists over the isolation region and the first stressor insulating film or between side faces facing in the gate width direction of the part of the first gate electrode which exists over the isolation region and the first base insulating film.

14. The semiconductor device of claim 1, further comprising a second MIS transistor provided on a second active region of the semiconductor substrate, the second MIS transistor including:
a second gate insulating film provided on the second active region;
a second gate electrode provided on the second gate insulating film; and
a second base insulating film provided on the second gate electrode,
wherein the second active region is surrounded by the isolation region formed in the semiconductor substrate, and
the first active region and the second active region are separated from each other by the isolation region.

15. The semiconductor device of claim 14, wherein the second MIS transistor further includes a second side wall provided between side faces of the second gate electrode and the second base insulating film.

* * * * *